US009876047B2

(12) United States Patent
Wada et al.

(10) Patent No.: US 9,876,047 B2
(45) Date of Patent: Jan. 23, 2018

(54) PHOTOELECTRIC CONVERSION APPARATUS AND INFORMATION PROCESSING APPARATUS

(71) Applicant: CANON KABUSHIKI KAISHA, Tokyo (JP)

(72) Inventors: Yoichi Wada, Yokohama (JP); Hajime Ikeda, Yokohama (JP); Tatsuhito Goden, Machida (JP); Keisuke Ota, Tokyo (JP); Toshinori Hasegawa, Yokohama (JP); Masahiro Kobayashi, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 15/371,818

(22) Filed: Dec. 7, 2016

(65) Prior Publication Data
US 2017/0170227 A1  Jun. 15, 2017

(30) Foreign Application Priority Data

Dec. 15, 2015  (JP) .................................. 2015-244393
Dec. 24, 2015  (JP) .................................. 2015-252403

(51) Int. Cl.
*H01L 27/146* (2006.01)
*H04N 5/374* (2011.01)
*G01S 7/00* (2006.01)
*H04N 5/3745* (2011.01)

(52) U.S. Cl.
CPC .......... *H01L 27/14643* (2013.01); *G01S 7/00* (2013.01); *H01L 27/14636* (2013.01); *H04N 5/37457* (2013.01)

(58) Field of Classification Search
CPC ......... H01L 27/14643; H01L 27/14636; H01L 27/14609; H01L 31/103; H04N 5/335; H04N 5/378; H04N 5/2253; H04N 5/37457; G01S 7/4914; G01S 7/00; G01S 17/36
USPC ............................................................ 348/308
See application file for complete search history.

(56) References Cited

U.S. PATENT DOCUMENTS

| 7,601,992 B2 * | 10/2009 | Hashimoto | ....... H01L 27/14609 257/184 |
| 8,134,690 B2 * | 3/2012 | Tachino | .................. G01S 7/483 257/E27.15 |
| 9,232,163 B2 * | 1/2016 | Fossum | ................... G01S 17/89 |
| 9,344,657 B2 * | 5/2016 | Kim | ...................... G01C 15/06 |

(Continued)

FOREIGN PATENT DOCUMENTS

| JP | 2005-303268 A | 10/2005 |
| JP | 2006-190846 A | 7/2006 |

(Continued)

*Primary Examiner* — Pritham Prabhakher
(74) *Attorney, Agent, or Firm* — Canon U.S.A., Inc. IP Division

(57) ABSTRACT

A semiconductor apparatus includes a first photodiode arranged in a semiconductor substrate, a second photodiode arranged in the semiconductor substrate, a charge voltage conversion part connected to a cathode of the first photodiode and an anode of the second photodiode and configured to convert a charge amount in accordance with electrons generated in the first photodiode and holes generated in the second photodiode into a voltage, and a signal generation part configured to generate a signal in accordance with the voltage of the charge voltage conversion part.

33 Claims, 12 Drawing Sheets

(56) References Cited

U.S. PATENT DOCUMENTS

| | | | | |
|---|---|---|---|---|
| 2004/0195493 | A1* | 10/2004 | Hashimoto | H04N 5/335 250/214 R |
| 2007/0103748 | A1* | 5/2007 | Hashimoto | H01L 27/14609 359/15 |
| 2009/0114919 | A1* | 5/2009 | Kawahito | G01C 3/02 257/59 |
| 2010/0290028 | A1* | 11/2010 | Tachino | G01S 7/483 356/5.01 |
| 2011/0187908 | A1* | 8/2011 | Kawahito | H01L 27/14603 348/306 |
| 2014/0103412 | A1* | 4/2014 | Lee | H01L 27/14605 257/292 |
| 2014/0198183 | A1* | 7/2014 | Kim | G01S 17/89 348/46 |
| 2014/0252437 | A1* | 9/2014 | Oh | H01L 27/14643 257/292 |

FOREIGN PATENT DOCUMENTS

| | | |
|---|---|---|
| JP | 2008-245217 A | 10/2008 |
| JP | 2010-267720 A | 11/2010 |
| JP | 2011-166394 A | 8/2011 |
| WO | 07/119626 A1 | 10/2007 |

* cited by examiner

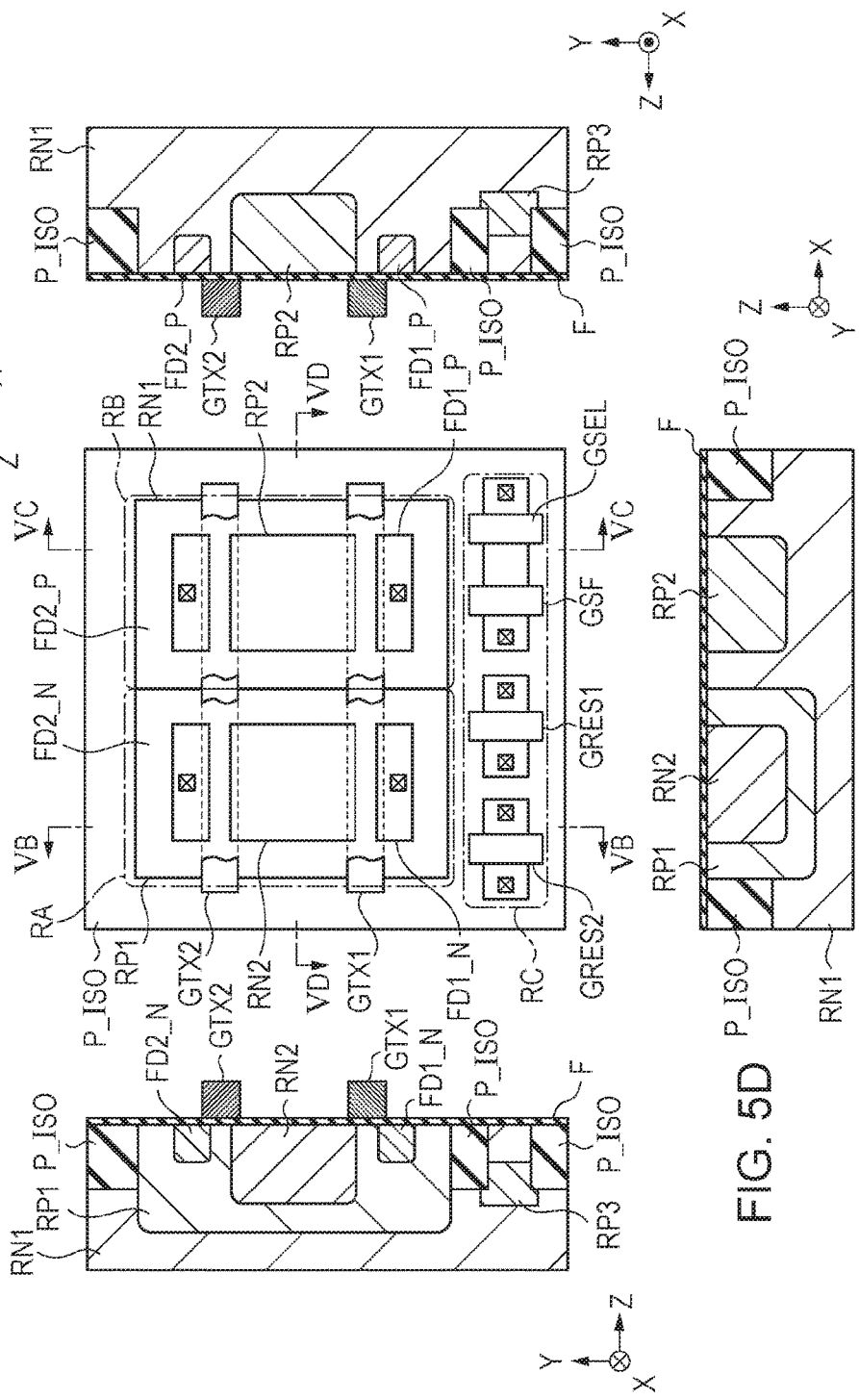

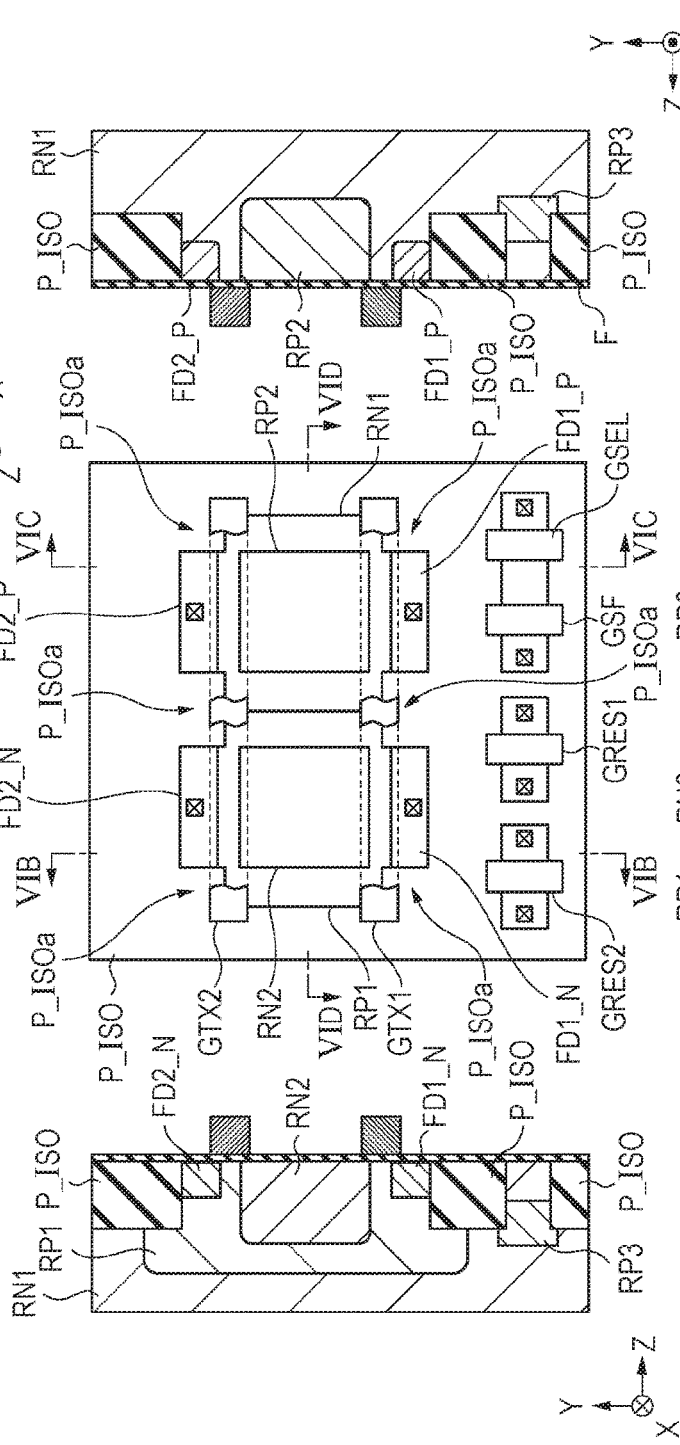

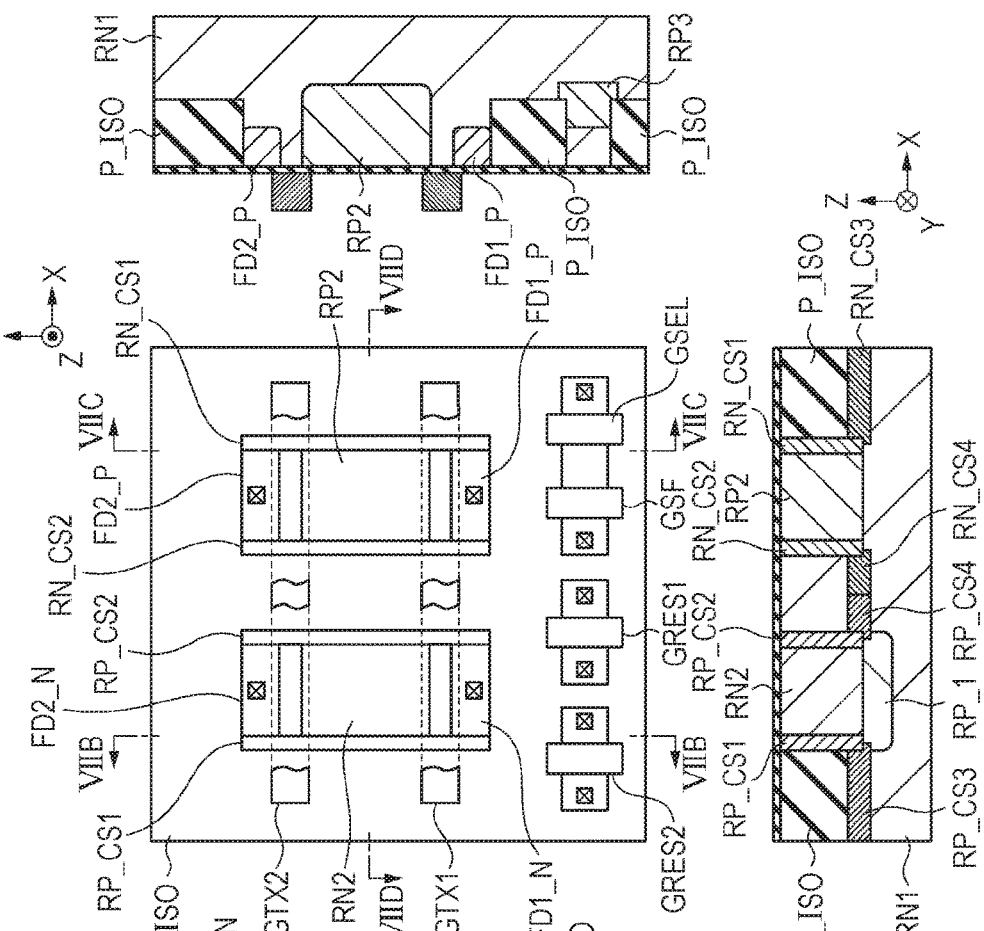

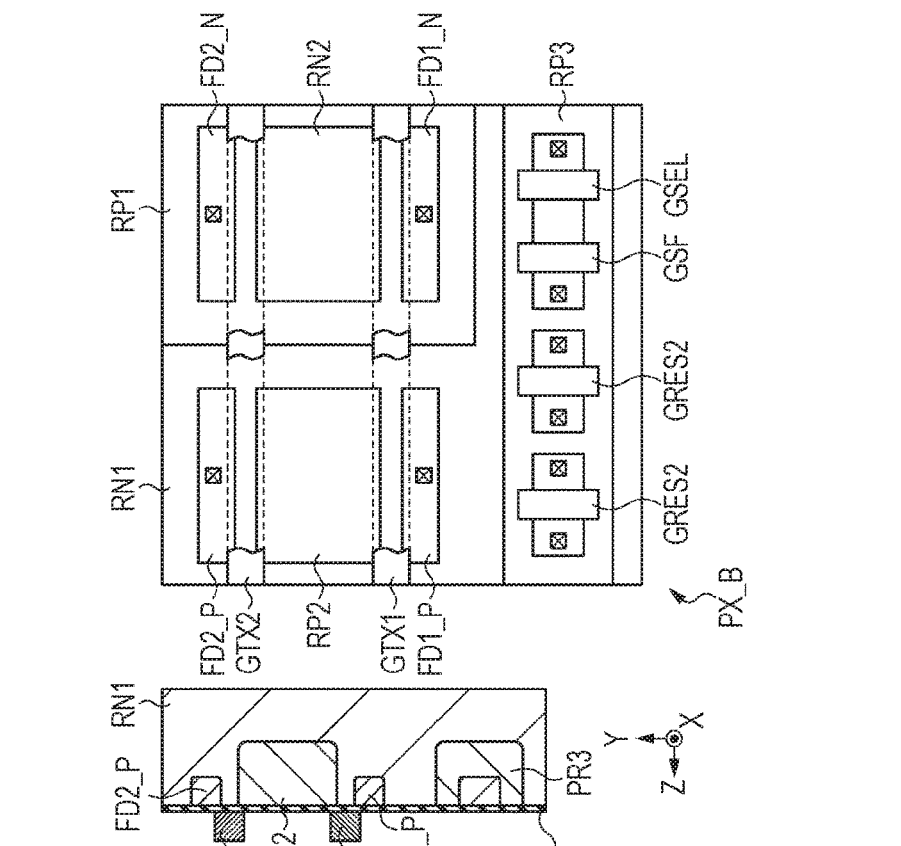

PHOTOELECTRIC CONVERSION APPARATUS AND INFORMATION PROCESSING APPARATUS

BACKGROUND OF THE INVENTION

Field of the Invention

Embodiments of the present invention relate to a photoelectric conversion apparatus and an information processing apparatus.

Description of the Related Art

A time of flight (TOF) method of measuring a distance to a target object by irradiating the target object with light and detecting reflected light from the object has been proposed as one of focusing methods. Specifically, the distance to the target object is measured on the basis of a period of time from a timing of the light irradiation until a timing of the reflected light detection (that is, a delay amount of the reflected light with respect to the irradiation light) and a light speed. At this time, since the reflected light from the target object is detected together with environment light corresponding to light in an external environment, a technology for performing the focusing while the environment light is taken into account is demanded.

FIG. 12 illustrates a configuration example of a light detecting element 1 according to a second exemplary embodiment of Japanese Patent Laid-Open No. 2005-303268 (in paragraph 0092 and subsequent paragraphs). The light detecting element 1 is provided with a first photosensitive unit 11a, a hole holding unit 13 corresponding to the first photosensitive unit 11a, a second photosensitive unit 11b, an electron holding unit 14 corresponding to the second photosensitive unit 11b, a recombination unit 15, and an output unit 16. The hole holding unit 13 holds holes generated by the first photosensitive unit 11a when a light source 2 is turned off (holes corresponding to the environment light). The electron holding unit 14 holds electrons generated by the second photosensitive unit 11b when the light source 2 is turned on (electrons corresponding to both the reflected light and the environment light from a target object 3). The recombination unit 15 causes recombination of the holes of the hole holding unit 13 (holes corresponding to the environment light) with the electrons of the electron holding unit 14 (electrons corresponding to both the reflected light and the environment light). As a result, the electrons corresponding to the reflected light among the reflected light and the environment light remain, and these electrons are read out by the output unit 16. According to this method, it is possible to obtain a signal corresponding to the reflected light among the reflected light and the environment light, which is advantageous to perform the focusing based on the TOF method at a high accuracy.

According to the configuration in which target carriers are taken out through the output unit 16 of the light detecting element 1 to detect the charge amount in accordance with the electrons and the holes as described in Japanese Patent Laid-Open No. 2005-303268, it is difficult to increase a read operation speed of the target carriers. For this reason, a focusing accuracy is not increased in a case where the focusing based on the TOF method is performed.

With reference to Japanese Patent Laid-Open No. 2005-303268 (paragraph 0045), such a structure is conceivable that a plurality of light detecting elements 1 each including the above-described respective units (the first photosensitive unit 11a, the second photosensitive unit 11b, and the like). According to this structure, the single light detecting element 1 corresponds to a unit pixel, and a signal for performing the focusing based on the TOF method is output from each of the light detecting elements 1, and a distance image is obtained as a result.

As one of methods of realizing this structure, two types of photodiodes are respectively used as the first photosensitive unit 11a and the second photosensitive unit 11b. For example, it is conceivable to use a photodiode composed of a P-type semiconductor region and an N-type semiconductor region surrounding the P-type semiconductor region as the first photosensitive unit 11a. For example, it is conceivable to use a photodiode composed of an N-type semiconductor region and a P-type semiconductor region surrounding the N-type semiconductor region as the second photosensitive unit 11b. At this time, in a case where these two types of photodiodes are used, a structure of a pixel needs to be designed while not only electric separation in the pixels of the two types of photodiodes but also electric separation from a photodiode in an adjacent pixel are taken into account. It should be noted that Japanese Patent Laid-Open No. 2005-303268 does not describe specific structures including which type of a circuit element to be used to construct which type of a circuit, how to realize the above-described respective units on a semiconductor substrate, and the like.

SUMMARY OF THE INVENTION

The present technology provides a structure of a semiconductor apparatus that is advantageous to detect the charge amount in accordance with electrons and holes.

The present technology also provides a novel structure for appropriately electrically separating individual photodiodes from each other in a structure in which two types of photodiodes are arranged.

An aspect of the present disclosure relates to a semiconductor apparatus. The semiconductor apparatus includes a first photodiode arranged in a semiconductor substrate, a second photodiode arranged in the semiconductor substrate, a charge voltage conversion part connected to a cathode of the first photodiode and an anode of the second photodiode and configured to convert a charge amount in accordance with electrons generated in the first photodiode and holes generated in the second photodiode into a voltage, and a signal generation part configured to generate a signal in accordance with the voltage of the charge voltage conversion part, in which an element separation part constituted by an insulator is arranged between an active region where the first photodiode is arranged and an active region where a transistor constituting the signal generation part is arranged and between an active region where the second photodiode is arranged and an active region where a transistor constituting the signal generation part is arranged.

Another aspect of the present disclosure relates to a photoelectric conversion apparatus. The photoelectric conversion apparatus includes a semiconductor substrate provided with a plurality of light detecting units, each of the plurality of light detecting units including a first photodiode including a first semiconductor region of a first conductivity type which accumulates one of electrons and holes and a second photodiode including a second semiconductor region of a second conductivity type different from the first conductivity type which accumulates the other one of the electrons and the holes, the photoelectric conversion apparatus outputting a signal based on charges of at least one of the first photodiode and the second photodiode in each of the plurality of light detecting units, in which the plurality of light detecting units include a first unit and a second unit that are adjacent to each other, and the second photodiode of the first unit and the second photodiode of the second unit are located between the first photodiode of the first unit and the first photodiode of the second unit in a plan view with respect to a top surface of the semiconductor substrate.

Further features of the present invention will become apparent from the following description of exemplary embodiments with reference to the attached drawings.

BRIEF DESCRIPTION OF THE DRAWINGS

FIGS. 5A, 5B, 5C, and 5D are explanatory diagrams for describing an example of a structure of the pixel.

FIGS. 6A, 6B, 6C, and 6D are explanatory diagrams for describing an example of the structure of the pixel.

FIGS. 7A, 7B, 7C, and 7D are explanatory diagrams for describing an example of the structure of the pixel.

FIGS. 10A1, 10A2, 10B, 10C, and 10D are explanatory diagrams for describing an example of the structure of the pixel.

DESCRIPTION OF THE EMBODIMENTS

Hereinafter, exemplary embodiments of the present invention will be described with reference to the accompanying drawings. According to the exemplary embodiments of the present invention, for example, it is possible to appropriately electrically separate the individual photodiodes of the above-described two types from each other. Other advantages of the invention are described in detail with the exemplary embodiments of the present invention and may be sufficiently understood with reference to the detailed descriptions and the accompanying drawings. It should be noted that the respective drawings are merely illustrated for a purpose of describing a structure or a configuration, and dimensions of the illustrated respective members do not necessarily reflect actual dimensions. In addition, the same member or the same component is assigned with the same reference symbol in the respective drawings, and descriptions of the repeated contents will be omitted below.

Figure 1:
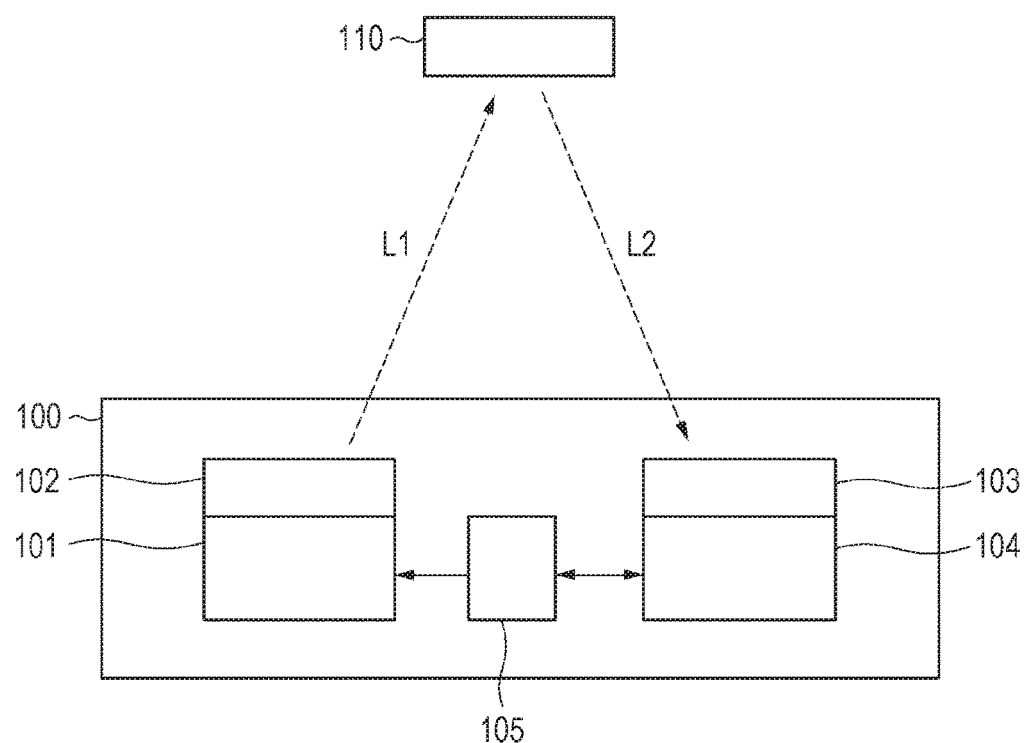
FIG. 1 is an explanatory diagram for describing a configuration example of an image pickup apparatus.

FIG. 1 is an explanatory diagram for describing a configuration example of an information processing apparatus 100 (hereinafter, will be referred to as an apparatus 100) to which a photoelectric conversion apparatus according to an exemplary embodiment of the present invention is applied. The apparatus 100 is provided, for example, with a light source 101 such as a light emitting diode (LED), optical systems 102 and 103 such as a lens, a detection component 104, and a processing component 105.

A target object 110 corresponding to a focusing target is irradiated with emitted light L1 of the light source 101 via the optical system 102. Light L2 includes reflected light from the target object 110 and is incident on the detection component 104 via the optical system 103. The detection component 104 supplies a signal based on the light L2 to the processing component 105. The detection component 104 corresponds to the photoelectric conversion apparatus according to the exemplary embodiment of the present invention and may also be referred to as a light detecting apparatus or simply referred to as a semiconductor apparatus (it should be also noted that the apparatus may be referred to as a device, a module, or the like). The processing component 105 drives the light source 101 and the detection component 104 and calculates information based on a distance to the target object 110 on the basis of the signal from the detection component 104 (a specific method for this calculation will be described below).

It should be noted that the configuration of the apparatus 100 is not limited to this example. Part of the present configuration may be altered in accordance with a purpose or the like, and another element may be collaterally added. For example, the apparatus 100 may be an image pickup apparatus (camera), and the detection component 104 may also function as an image pickup component. In another example, the apparatus 100 may be a focusing apparatus.

Figure 2:
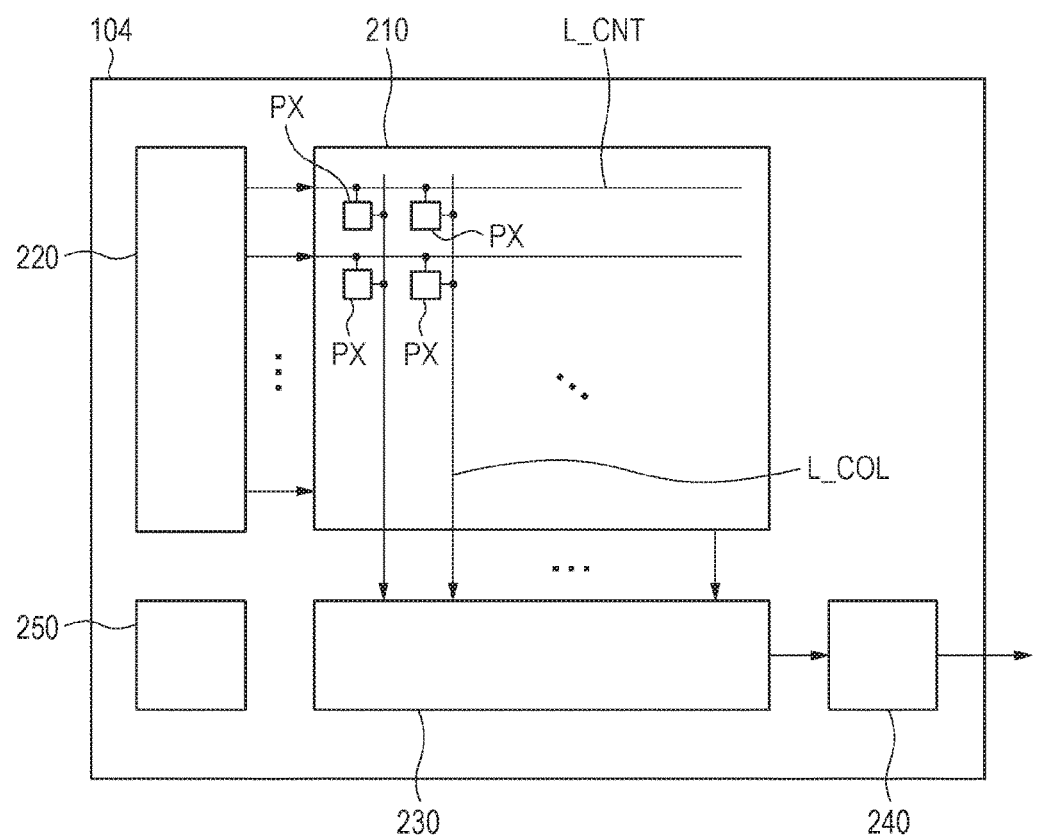
FIG. 2 is an explanatory diagram for describing a configuration example of a detection component.

FIG. 2 is an explanatory diagram for describing a configuration example of the detection component 104. The detection component 104 is provided, for example, with a pixel array 210, a driving section 220, a readout section 230, an output section 240, and a control section 250. The pixel array 210 may include a plurality of unit pixels PX arranged in a matrix on a semiconductor substrate (so as to form a plurality of rows and a plurality of columns).

In the present specification, the term "pixel" is represented while considerations are given of a case where the apparatus 100 is the image pickup apparatus. However, a "light detecting unit", a "light receiving unit", a "sensor unit", or the like may be represented instead of the "pixel", and these units may also be collectively referred to as a "unit". Similarly, a "unit array" may be represented instead of the "pixel array".

The driving section 220 drives the respective unit pixels PX in the pixel array 210 row by row by using the control lines L_CNT arranged on the respective rows, for example. The driven pixel PX outputs a signal in accordance with the light L2 as a pixel signal via a column signal line L_COL. The readout section 230 horizontally transfers the pixel signal output via the column signal line L_COL, and the output section 240 outputs the horizontally transferred pixel signal to the processing component 105 described above. The control section 250 controls the above-described respective sections on the basis of a reference signal such as a clock signal. The detection component 104 may be further provided with a power supply section (not illustrated) or the like configured to supply power to the above-described respective sections.

Figure 3:
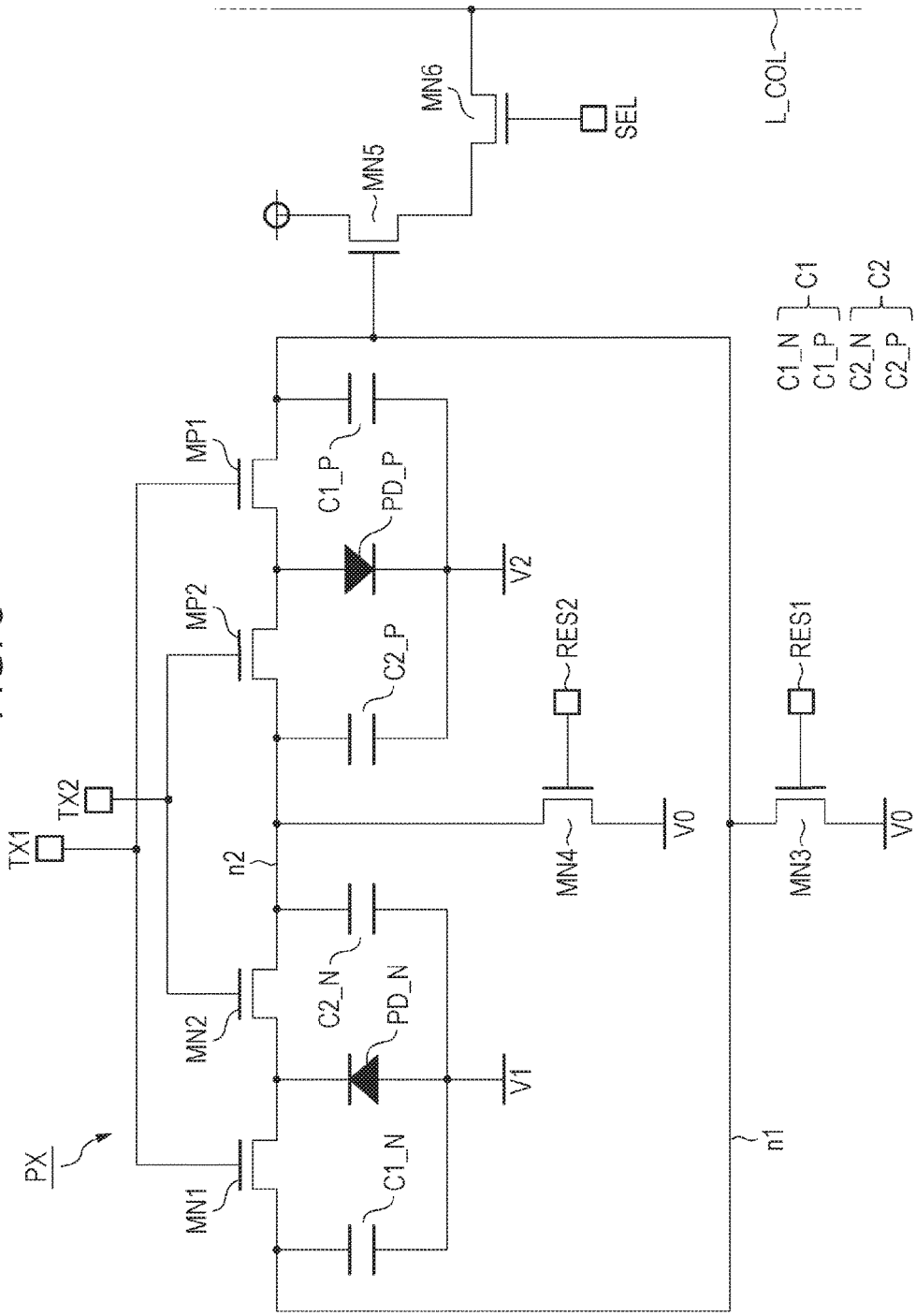
FIG. 3 is an explanatory diagram for describing a configuration example of a pixel.

FIG. 3 is an explanatory diagram for describing a configuration example of a unit pixel PX. The unit pixel PX includes, for example, photodiodes PD_N and PD_P, NMOS transistors MN1 to MN6 and PMOS transistors MP1 and MP2, and capacitances C1_N, C2_N, C1_P, and C2_P.

Each of the photodiodes PD_N and PD_P functions as a mutually independent photoelectric conversion part. The NMOS transistor MN1 (first transistor) is arranged so as to form a current path between a cathode of the photodiode PD_N (first photodiode) and a node n1. An anode of the photodiode PD_N is fixed to a voltage V1 (that is, which is connected to a power source line that supplies the voltage V1). The PMOS transistor MP1 (second transistor) is arranged so as to form a current path between an anode of the photodiode PD_P (second photodiode) and the node n1. A cathode of the photodiode PD_P is fixed to a voltage V2. In this example, the voltage V1 may be set as approximately −2 [V], and the voltage V2 may be set as +2 [V]. The photodiode PD_N may be represented as a photoelectric conversion part (first photoelectric conversion part). The same applies to the other photodiode PD_P, and the photodiode PD_P may be represented as a second photoelectric conversion part, for example.

The NMOS transistor MN2 is arranged so as to form a current path between the cathode of the photodiode PD_N and a node n2. The PMOS transistor MP2 transistor is arranged so as to form a current path between the anode of the photodiode PD_P and the node n2.

The capacitances C1_N and C2_N may be constituted by an N-type (first conductivity type) semiconductor region and a P-type (second conductivity type) semiconductor region surrounding the N-type semiconductor region (a detail thereof will be described below). It can also be represented that the capacitances C1_N and C2_N may be constituted by the P-type semiconductor region and the N-type semiconductor region formed in the P-type semiconductor region. One terminal of the capacitance C1_N is connected to the node n1, and the other terminal of the capacitance C1_N is fixed to the voltage V1. One terminal of the capacitance C2_N is connected to the node n2, and the other terminal of the capacitance C2_N is fixed to the voltage V1. The capacitances C1_P and C2_P may be constituted by the P-type semiconductor region and the N-type semiconductor region surrounding the P-type semiconductor region (a detail thereof will be described below). It can also be represented that the capacitances C1_P and C2_P may be constituted by the N-type semiconductor region and the P-type semiconductor region formed in the N-type semiconductor region. One terminal of the capacitance C1_P is connected to the node n1, and the other terminal of the capacitance C1_P is fixed to the voltage V2. One terminal of the capacitance C2_P is connected to the node n2, and the other terminal of the capacitance C2_P is fixed to the voltage V2.

It should be noted that the capacitance C1_N and the capacitance C1_P are distinguished from each other herein, but these capacitances may be collectively referred to as a "capacitance C1" corresponding to a first charge holding part. That is, since the capacitance C1_N and the capacitance C1_P can be distinguished from each other in terms of structures, these capacitances are individually illustrated herein. However, both the capacitances are fixed to a constant voltage on an opposite side to the node n1 side, and therefore these capacitances may be combined with each other and equivalently regarded as a single capacitance component. A voltage in accordance with a charge amount held in the capacitance C1 and an electrostatic capacitance of the capacitance C1 is generated in the capacitance C1, and therefore the capacitance C1 may be referred to as a first charge voltage conversion part. Similarly, the capacitance C2_N and the capacitance C2_P may be collectively referred to as a "capacitance C2" corresponding to a second charge holding part, and also the capacitance C2 may be referred to as a second charge voltage conversion part. The capacitance C1_N holds electrons generated by photoelectric conversion in the photodiode PD_N, and the capacitance C1_P holds holes generated by photoelectric conversion in the photodiode PD_P. The capacitance C1 corresponding to a capacitance obtained by combining the capacitance C1_N and the capacitance C1_P with each other holds a charge amount equivalent to a difference between the electrons and the holes. A potential difference (voltage) based on the charge amount/electrostatic capacitance is generated in the capacitance C1. Therefore, the capacitance C1_N, the capacitance C1_P, or the capacitance C1 obtained by combining these capacitances with each other respectively holds the voltage in accordance with the charges from the photodiode, and in other words, functions as a charge voltage conversion part configured to convert the charges into a voltage. Similarly, the capacitance C2_N and the capacitance C2_P may be collectively referred to as the "capacitance C2" corresponding to the second charge holding part, and the capacitance C2_N, the capacitance C2_P, and the capacitance C2 obtained by combining these capacitances with each other can be used as a charge voltage conversion part.

Gates of the NMOS transistor MN1 and the PMOS transistor MP1 are supplied with a control signal TX1 via the control line L_CNT. For example, when the control signal TX1 is at a high level, the NMOS transistor MN1 is put into a conductive state, and on the other hand, the PMOS transistor MP1 is put into a non-conductive state. For example, when the control signal TX1 is at a low level, the NMOS transistor MN1 is put into the non-conductive state, and on the other hand, the PMOS transistor MP1 is put into the conductive state. Similarly, gates of the NMOS transistor MN2 and the PMOS transistor MP2 are supplied with the control signal TX2 via the control line L_CNT.

The NMOS transistor MN3 is arranged so as to form a current path between the node n1 and the power source line having a voltage V0. A gate of the NMOS transistor MN3 is supplied with a control signal RES1 via the control line L_CNT, and the NMOS transistor MN3 initializes the capacitances C1_N and C1_P in response to the control signal RES1. Similarly, the NMOS transistor MN4 is arranged so as to form a current path between the node n2 the power source line having the voltage V0, and the NMOS transistor MN4 initializes the capacitances C2_N and C2_P in response to a control signal RES2. In this example, the voltage V0 may be set as 0 [V].

It should be noted that the mode is illustrated in this example in which the NMOS transistors MN3 and MN4 are respectively supplied with the mutually different control signals RES1 and RES2, but in another example, the NMOS transistors MN3 and MN4 may be supplied with a common control signal. In addition, the mode is illustrated in this example in which both the NMOS transistors MN3 and MN4 are fixed to the voltage V0, but in another example, the NMOS transistors MN3 and MN4 may be fixed to mutually different voltages.

The NMOS transistor MN5 performs a source follower operation in accordance with a voltage of the node n1. The NMOS transistor MN6 outputs a signal in accordance with a signal in accordance with a voltage of a source of the NMOS transistor MN5 as a pixel signal to the column signal line L_COL in response to a control signal SEL supplied via the control line L_CNT. The NMOS transistors MN5 and MN6 correspond to a signal generation part configured to read out (or output) the pixel signal (readout circuit part configured to read out (or output) the pixel signal), and in this example, an NMOS transistor is used as both of these transistors, but a PMOS transistor may be used instead. The signal generation part functions as a circuit part configured to output the pixel signal to an outside of the pixel and may be referred to as a signal output part (or simply referred to as an output part) or the like.

According to the structure in which the charge voltage conversion part and the signal generation part in addition to the two types of photoelectric conversion parts are provided in the unit pixel PX as described above, the signal based on the charge amount in accordance with the electrons and the holes can be output from the unit pixel PX. For this reason, it is possible to increase the speed of the detection of the charge amount in accordance with the electrons and the holes as compared with a case where the electrons or the holes are transferred to a final output section of the semiconductor apparatus. The configuration of the unit pixel PX is, of course, not limited to the above-described example, and part of the configuration may be appropriately altered when necessary. For example, the configuration is exemplified in this example in which the charges of the photodiode (PD_N or the like) are transferred to the capacitance (C1 or the like) by the transfer transistor (MN1 or the like), and the signal in accordance with the transferred charges is output as the pixel signal via the transistor (MN5 or the like). According to this configuration example, it is possible to switch the photodiode that performs the readout of the charges at a high speed and read out the signal. Thus, this configuration example is appropriate when the focusing based on the TOF method is performed. However, in another example, the photodiode (PD_N or the like) may be directly connected to the capacitance (C1 or the like) without the intermediation of the transfer transistor (MN1 or the like). In addition, in another example, another transistor may be further arranged between the transfer transistor (MN1 or the like) and the capacitance (C1 or the like). That is, it may be sufficient when the capacitance (C1 or the like) is configured to hold the charges generated and accumulated in the photodiode (PD_N or the like) or the voltage in accordance with the charges and provide the charges or the voltage to the downstream readout circuit section.

In addition, a configuration may be adopted in which the plurality of unit pixels PX share a single readout circuit part. In this case too, it can be regarded that each of the unit pixels PX includes the readout circuit part. Moreover, at least part of the readout circuit part can be arranged on the semiconductor substrate and outside the pixel array 210. For example, a current source for the source follower operation may be arranged outside the pixel array 210. Furthermore, it is possible to transfer the charges to the outside of the pixel array 210 by using a charge transfer element such as, for example, a CCD and generate a signal in the readout circuit section arranged outside the pixel array 210.

Figure 4A:
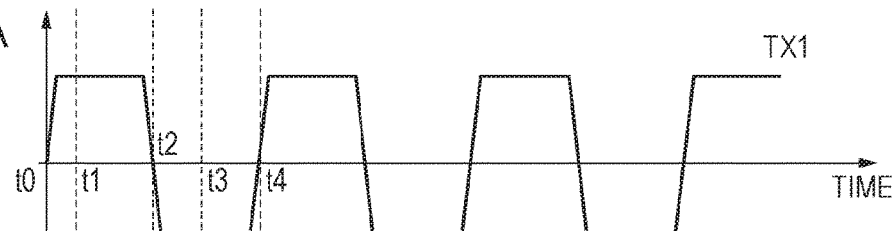
FIGS. 4A, 4B, 4C, and 4D are explanatory diagrams for describing an example of a driving method for the pixel.
Figure 4B:
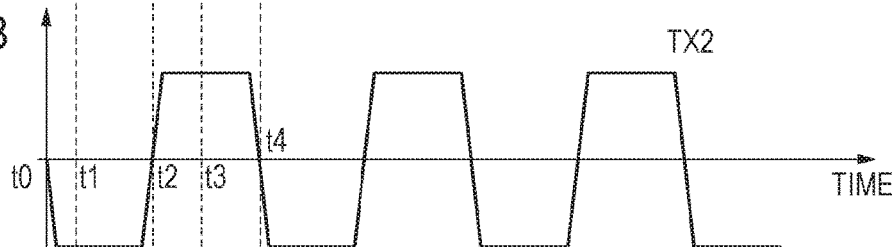

FIGS. 4A, 4B, 4C, and 4D are timing charts for describing an example of a driving method of the unit pixel PX when the focusing based on the TOF method is performed (a horizontal axis indicates a time axis). FIGS. 4A and 4B respectively illustrate waveforms of the control signals TX1 and TX2 (a vertical axis indicates a signal level). When the control signal TX1 is at the high level (positive voltage), the NMOS transistor MN1 is put into the conductive state, and the PMOS transistor MP1 is put into the non-conductive state. On the other hand, when the control signal TX1 is at the low level (negative voltage), the PMOS transistor MP1 is put into the conductive state, and the NMOS transistor MN1 is put into the non-conductive state. It should be noted that, when the control signal TX1 is 0 [V], it is supposed that both the NMOS transistor MN1 and the PMOS transistor MP1 are put into the non-conductive state. The same also applies to the control signal TX2.

Figure 4C:
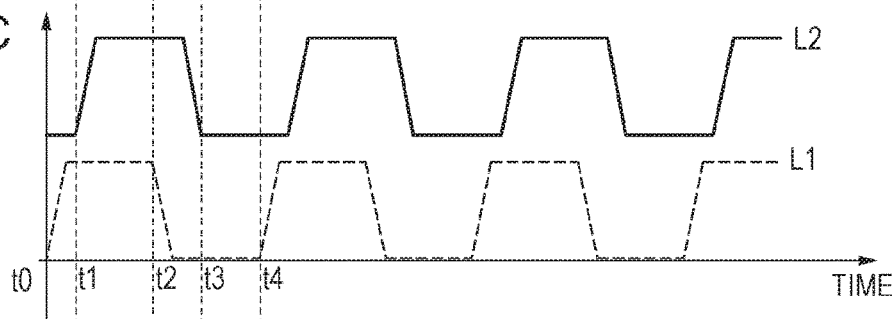

FIG. 4C illustrates waveforms of light amounts of the lights L1 and L2 (a vertical axis indicates the light amount). As described above, the light L1 is light generated by the light source 101. As illustrated in the drawing, the light L1 repeats lighting (on) and extinction (off) of the light source 101 in a predetermined cycle. The light L2 is light received by the detection component 104 and may include not only reflected light from the target object 110 but also environment light corresponding to light in the external environment. For this reason, with regard to the received light L2, the drawing illustrates a low level that is not 0 and corresponds to the extinction of the light source 101 and a high level that is higher than the low level and corresponds to the lighting of the light source 101. A delay (phase difference) equivalent to a distance to the target object 110 with respect to the light L1 is generated in the received light L2.

As may be understood from FIGS. 4A, 4B, and 4C, the cycle of the high level/low level of the control signals TX1 and TX2 is synchronized with the cycle of the lighting/extinction of the light source 101. In this example, the switching of the conductive state/non-conductive state in each of the NMOS transistors MN1 and MN2 and the PMOS transistors MP1 and MP2 that receive the control signal TX1 or TX2 is performed substantially at the same time as the timing for the switching of the lighting/extinction of the light source 101.

Figure 4D:
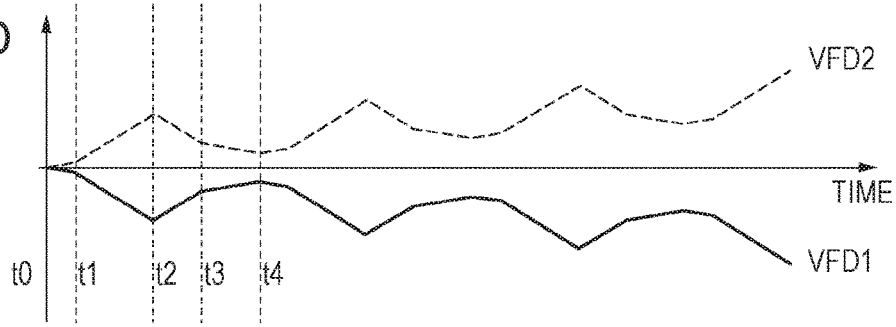

FIG. 4D illustrates a voltage VFD1 (specifically, a voltage of the capacitances C1_N and C1_P) of the node n1 and a voltage VFD2 (specifically, a voltage of the capacitances C2_N and C2_P) of the node n2 (a vertical axis indicates a voltage value). That is, the voltage VFD1 corresponds to the charge amount held in the capacitance C1, and the voltage VFD2 corresponds to the charge amount held in the capacitance C2.

First (before a time t0), the NMOS transistors MN3 and MN4 initialize the capacitances C1_N and C1_P and C2_N and C2_P, that is, initialize the voltages VFD1 and VFD2. In this example (V0=0 [V], V1=−2 [V], and V2=+2 [V]), initial values of the voltages VFD1 and VFD2 are substantially 0 [V]. Along with this, the NMOS transistors MN1 and MN2 and the PMOS transistors MP1 and and MP2 are put into the conductive state, so that the photodiodes PD_N and PD_P are initialized. For example, a cathode voltage of the photodiode PD_N after the initialization becomes approximately −1 [V], and an anode voltage of the photodiode PD_P after the initialization becomes approximately +1 [V].

At the time t0, the light source 101 is turned on. In addition, at the time t0, the control signal TX1 is set at the high level, and also the control signal TX2 is set at the low level, so that the NMOS transistor MN1 and the PMOS transistor MP2 are put into the conductive state, and also the NMOS transistor MN2 and the PMOS transistor MP1 are put into the non-conductive state. That is, the photodiode PD_N is connected to the capacitance C1_N by the NMOS transistor MN1, and the photodiode PD_P is connected to the capacitance C2_P by the PMOS transistor MP2. Thereafter, at a time t1, the received light L2 is set at the high level.

Herein, since the received light L2 is at the low level (that is not 0) during a period from the time t0 to the time t1, the electrons in accordance with the light amount of the light L2 at the low level corresponding to the electrons generated and accumulated in the photodiode PD_N are transferred to the capacitance C1_N. Similarly, the holes in accordance with the light amount of the light L2 at the low level corresponding to the holes generated and accumulated in the photodiode PD_P are transferred to the capacitance C1_P. Thus, as illustrated in FIG. 4D, at the time t1, the voltage VFD1 becomes the voltage in accordance with the transferred electrons, and similarly, the voltage VFD2 becomes the voltage in accordance with the transferred holes.

At the time t1, since the received light L2 is set at the high level, the electron generation amount in the photodiode PD_N and the hole generation amount in the photodiode PD_P at and after the time t1 (until a time t2 which will be described below) respectively become higher than those during the period from the time t0 to the time t1. That is, the voltage change amounts of the voltages VFD1 and VFD2 during a period from the time t1 to the time t2 respectively become higher than those during the period from the time t0 to the time t1.

At the time t2, the light source 101 is turned off. In addition, at the time t2, the control signal TX1 is set at the low level, and also the control signal TX2 is set at the high level, so that the NMOS transistor MN1 and the PMOS transistor MP2 are put into the non-conductive state, and also the NMOS transistor MN2 and the PMOS transistor MP1 are put into the conductive state. That is, the photodiode PD_N is connected to the capacitance C2_N by the NMOS transistor MN2, and also, the photodiode PD_P is connected to the capacitance C1_P by the PMOS transistor MP1.

As a result, at and after the time t2 (until a time t3 which will be described below), the holes in accordance with the light amount of the light L2 at the high level corresponding to the holes generated and accumulated in the photodiode PD_P are transferred to the capacitance C1_P. Herein, the holes transferred to the capacitance C1_P and the electrons transferred to the capacitance C1_N during a period from the time t0 to the time t2 are recombined with each other to disappear. For this reason, the voltage VFD1 is increased (as described above, since the capacitance C1_N and the capacitance C1_P correspond to the single capacitance C1, it can also be mentioned that the voltage VFD1 is increased simply by the transfer of the holes of the capacitance C1). Similarly, during a period from the time t2 to the time t3, the electrons in accordance with the light amount of the light L2 at the high level corresponding to the electrons generated and accumulated in the photodiode PD_N are transferred to the capacitance C2_N, and the voltage VFD2 is decreased.

Thereafter, since the received light L2 is set at the low level at the time t3, the electron generation amount in the photodiode PD_N and the hole generation amount in the photodiode PD_P at and after the time t3 (until a time t4 which will be described below) respectively become lower than those during the period from the time t2 to the time t3. That is, the voltage change amounts of the voltages VFD1 and VFD2 during a period from the time t3 to the time t4 respectively become lower than those during the period from the time t2 to the time t3.

At the time t4, the light source 101 is turned on again, so that the control signal TX1 is set at the high level, and also the control signal TX2 is set at the low level. That is, a period from the time t0 to the time t4 is set as one cycle, and the above-described series of operations are periodically repeated at and after the time t4. It should be noted that a period for the one cycle is approximately 10 [nsec] to 100 [nsec].

While the above-described series of operations are repeated, the voltage VFD1 (VFD2) is gradually shifted from an initial value (0 [V] in this example). For example, as in the example of FIG. 4C, in a case where the delay amount of the received light L2 with respect to the light L1 is low (in a case where the delay amount is lower than T/4 when the cycle of the above-described series of operations is set as T), the voltage VFD1 is decreased (the voltage VFD2 is increased). In contrast to this, in a case where the delay amount of the received light L2 with respect to the light L1 is high (in a case where the delay amount is higher than T/4), the voltage VFD1 is increased (the voltage VFD2 is decreased). It should be noted that, in a case where the delay amount of the received light L2 with respect to the light L1 is substantially equal to T/4, the voltage VFD1 (VFD2) substantially remains at the initial value (0 [V] in this example). Thus, the distance to the target object 110 can be calculated on the basis of the voltage VFD1 (VFD2) after the above-described series of operations are repeated. That is, the focusing based on the TOF method can be performed.

In this example, the mode is exemplified in which the signal in accordance with the voltage VFD1 is read out as the pixel signal by the transistors MN5 and MN6, but in another example, the signal in accordance with the voltage VFD2 may be read out. In a case where a signal in accordance with only one of the voltages VFD1 and VFD2 is read out, the transistor that is not used for the above-described readout among the transistors MN1 to MN4 and MP1 and MP2 does not necessarily need to be arranged. In addition, in another example, both the signal in accordance with the voltage VFD1 and the signal in accordance with the voltage VFD2 are read out, and it is also possible to improve a signal-to-noise (SN) ratio by using both the signals.

Hereinafter, several examples of the structure of the unit pixel PX will be described with reference to the accompanying drawings.

FIRST EXAMPLE

A first example of the structure of the unit pixel PX will be described with reference to FIGS. 5A, 5B, 5C, and 5D. FIG. 5A is a layout diagram of the unit pixel PX in a plan view (plan view with respect to a top surface of the semiconductor substrate or a surface parallel to the top surface, which will be hereinafter simply referred to as a "plan view"). FIG. 5B is a schematic diagram illustrating a cross-sectional structure viewed from a cut line VB-VB. FIG. 5C is a schematic diagram illustrating a cross-sectional structure viewed from a cut line VC-VC. FIG. 5D is a schematic diagram illustrating a cross-sectional structure viewed from a cut line VD-VD. In the drawings, to facilitate understanding of this structure, correspondence relationships of the respective drawings are illustrated by using an X direction (corresponding to a first direction), a Y direction intersecting the X direction (corresponding to a second direction), and a Z direction intersecting a plane surface formed by the X direction and the Y direction. It should be noted that the X direction and the Y direction may respectively correspond to the row direction and the column direction of the pixel array 210 described above.

For example, a P-type semiconductor region RP1 is formed in an N-type semiconductor region RN1 corresponding to at least portion of the semiconductor substrate. Herein, a state of "being formed in the N-type region RN1" means a state of "being surrounded by the N-type region RN1". That is, the P-type region RP1 is surrounded by the N-type region RN1. The same also applies to the following descriptions of the other regions.

The photodiode PD_N, the transistors MN1 and MN2, and the capacitances C1_N and C2_N described above are formed in the P-type region RP1. For example, the photodiode PD_N is constituted by forming an N-type semiconductor region RN2 (will be referred to as an N-type region RN2) in the P-type region RP1. The capacitance C1_N is constituted by forming an N-type floating diffusion FD1_N in the P-type region RP1. Similarly, the capacitance C2_N is constituted by forming an N-type floating diffusion FD2_N in the P-type region RP1.

It should be noted that the N-type region RN2 corresponding to the cathode of the photodiode PD_N corresponds to a source of the NMOS transistor MN1 (integrated with the source), and the floating diffusion FD2_N corresponds to a drain of the NMOS transistor MN1 (integrated with the drain). From this viewpoint, the NMOS transistor MN1 corresponding to the MOS transistor for the charge transfer may be represented as a transfer part (first transfer part). The same also applies to the other transistors MN2, MP1, and MP2, and the transistors MN2, MP1, and MP2 may be respectively represented as second to fourth transfer parts, for example.

An electrode GTX1 corresponding to the gate of the NMOS transistor MN1 is arranged between the floating diffusion FD1_N and the N-type region RN2 in the plan view and also on the semiconductor substrate via an insulating film F. Similarly, an electrode GTX2 corresponding to the gate of the NMOS transistor MN2 is arranged between the floating diffusion FD2_N and the N-type region RN2 in the plan view and also on the semiconductor substrate via the insulating film F.

The photodiode PD_P, the PMOS transistors MP1 and MP2, and the capacitances C1_P and C2_P described above are formed in the N-type region RN1. For example, the photodiode PD_P is constituted by forming a P-type semiconductor region RP2 in the N-type region RN1. The capacitance C1_P is constituted by forming a P-type floating diffusion FD1_P in the N-type region RN1. Similarly, the capacitance C2_P is constituted by forming a P-type floating diffusion FD2_P in the N-type region RN1. The floating diffusion FD1_P is connected to the floating diffusion FD1_N via a conductor such as a contact plug or a wiring. As a result, the floating diffusion FD1_N and the floating diffusion FD1_P are mutually electrically connected to each other to constitute the above-described combined capacitance C1. The electrode GTX1 also corresponds to the gate of the PMOS transistor MP1 in addition to the gate of the NMOS transistor MN1. That is, the gate of the NMOS transistor MN1 and the gate of the PMOS transistor MP1 are commonly formed by the electrode GTX1. Similarly, the electrode GTX2 also corresponds to the gate of the PMOS transistor MP2. It should be noted that it is sufficient even when the gate electrode GTX1 (GTX2) is not commonly formed, and an electrode corresponding to each of the NMOS transistor MN1 and the PMOS transistor MP1 (MN2 and MP2) may be individually formed.

In FIG. 5A, a region where the respective elements including the photodiode PD_N, the transistors MN1 and MN2, and the capacitances C1_N and C2_N are represented as a first region RA. A region where the respective elements including the photodiode PD_P, the PMOS transistors MP1 and MP2, and the capacitances C1_P and C2_P are represented as a second region RB.

The region RA and the region RB are aligned in the X direction as illustrated in the drawing, for example, and these regions may be configured to have a mutually symmetric relationship in terms of structures or electrical characteristics. For example, with regard to the region RA, the photodiode PD_N, the transistors MN1 and MN2, and the capacitances C1_N and C2_N are arranged along the Y direction. For example, the photodiode PD_N is arranged between the capacitances C1_N and C2_N. Herein, the capacitance C1_N corresponding to the readout target is located on a third region RC side where the respective elements of the transistors MN3 to MN6 are arranged, and the capacitance C2_N is arranged on the opposite side thereto, but the sides may be reversed. The NMOS transistor MN1 is arranged between the capacitance C1_N and the photodiode PD_N, and the NMOS transistor MN2 is arranged between the capacitance C2_N and the photodiode PD_N. The same also applies to the region RB (the photodiode PD_P, the PMOS transistors MP1 and MP2, and the capacitances C1_P and C2_P). In addition, the photodiode PD_N, the transistors MN1 and MN2, and the capacitances C1_N and C2_N may be respectively arranged so as to be aligned with the photodiode PD_P, the PMOS transistors MP1 and MP2, and the capacitances C1_P and C2_P in the X direction.

As may be understood from FIG. 5A, the respective elements in the region RA (the photodiode PD_N and the like) and the respective elements in the region RB (the photodiode PD_P and the like) are formed in the same (single) active region. The active region is a region where one or circuit elements and a circuit part composed of those circuit elements are substantially formed in a semiconductor member. For example, the active region is a region sectioned by an element separation part P_ISO corresponding to an insulator arranged in the semiconductor substrate in the plan view. That is, in this example, the region RA and the region RB are not separated from each other by the element separation part P_ISO.

Each of elements or parts corresponding to the transistors MN3 to MN6 is arranged at a position away from the region RA and the region RB described above in the Y direction. Electrodes GRES1, GRES2, GSF, and GSEL in the drawing respectively correspond to the gates of the transistors MN3, MN4, MN5, and MN6. The floating diffusion FD1_N and the floating diffusion FD1_P are connected to the electrode GSF of the NMOS transistor MN5 via a conductor such as a contact plug or a wiring.

It should be noted that an R-type region RP3 illustrated in FIGS. 5B and 5C corresponds to P-type wells of the transistors MN3 to MN6. A mode is illustrated in this example in which the P-type regions RP1 and RP3 are mutually independent (separated from the N-type region RN1), but these regions may be formed in an integrated manner.

The third region RC where the respective elements of the transistors MN3 to MN6 are arranged is electrically separated from both the region RA and the region RB described above by the element separation part P_ISO. The element separation part P_ISO may be composed, for example, of an insulating material such as oxide silicon and may be arranged so as to extend up to a deep position from the top surface of the semiconductor substrate. The element separation part P_ISO may be formed by shallow trench isolation (STI) exemplified herein, or by a local oxidation of silicon (LOCOS) method in another example. In addition, the element separation part P_ISO may extend in the X direction and the Y direction along an outer edge of the unit pixel PX, and the element separation part P_ISO may electrically separate the unit pixel PX from its adjacent pixel PX.

In the present structure, the elements in the region RA (the photodiode PD_N and the like) and the elements in the region RB (the photodiode PD_P and the like) are electrically separated from each other by a PN junction formed by the P-type region RP1 and the N-type region RN1. According to the present structure, as compared with a case where the element separation part such as the STI is used for the separation of these elements, for example, sizes of the photodiodes PD_N and PD_P can be increased. In addition, although the detail will be described with reference to the following example, according to the present structure, as compared with a case where the element separation part such as the STI is used for the separation of these elements, for example, it is also possible to reduce noise components derived from a dark current and/or improve a withstand pressure with respect to breakdown.

On the other hand, the elements in the region RC (the NMOS transistors MN3 to MN6) are electrically separated from both the elements in the region RA and the elements in the region RB described above by the element separation part P_ISO such as the STI. According to the present structure, for example, while the mutually symmetric relationship of the elements in the region RA and the elements in the region RB in terms of structures or electrical characteristics is maintained, the elements in the region RC can be electrically separated from both the elements in the region RA and the elements in the region RB.

According to the present structure, since the element separation part P_ISO is provided, it is advantageous to appropriately electrically separate each of a plurality of elements from one another in a structure where the plurality of elements having mutually different polarities or conductive types are arranged in a mixed manner on the same substrate. For this reason, the photoelectric conversion part (the photodiodes PD_N and PD_P) and the circuit part can be arranged in the unit pixel PX. Herein, the NMOS transistors MN1 to MN6, the PMOS transistors MP1 and MP2, the photodiode PD_N attributed to the generation and accumulation of the electrons, the photodiode PD_P attributed to the generation and accumulation of the holes, and the like are exemplified as the plurality of elements. However, the plurality of elements are not limited to these elements and may further collaterally include other elements when necessary.

SECOND EXAMPLE

A second example of the structure of the unit pixel PX will be described with reference to FIGS. 6A, 6B, 6C, and 6D. It should be noted that FIGS. 6A, 6B, 6C, and 6D according to this example are illustrated so as to respectively correspond to FIGS. 5A, 5B, 5C, and 5D according to the first example, so that this example and the first example can be compared with each other.

This example is different from the above-described first example mainly in that the element separation part P_ISO extends so as to surround the floating diffusion FD1_N and the like in the plan view. More specifically, as illustrated in FIG. 6A, the element separation part P_ISO includes a part P_ISOa that extends so as to surround each of the floating diffusions FD1_N, FD2_N, FD1_P, and FD2_P. For example, when attention is paid on the floating diffusion FD1_N, the element separation part P_ISO extends along an outer edge of the floating diffusion FD1_N (except for a side close to the N-type region RN2) in the plan view. For example, one of parts P_ISOa illustrated in the drawing is a part that extends between the floating diffusions FD1_N and FD1_P in the plan view so as to electrically separate these floating diffusions from each other. Another one of the parts P_ISOa is a part that extends between the floating diffusions FD2_N and FD2_P in the plan view so as to electrically separate these floating diffusions from each other.

The element separation based on the STI or the like is advantageous in reduction of a leak current or the like as compared with the element separation based on the PN junction, for example. For this reason, according to the present structure, effects similar to the above-described first example may be obtained, and also, for example, it is possible to appropriately separate the floating diffusions FD1_N and FD1_P from each other and the floating diffusions FD2_N and FD2_P from each other.

THIRD EXAMPLE

A third example of the structure of the unit pixel PX will be described with reference to FIGS. 7A, 7B, 7C, and 7D. It should be noted that FIGS. 7A, 7B, 7C, and 7D according to this example are illustrated so as to respectively correspond to FIGS. 5A, 5B, 5C, and 5D according to the first example, so that this example and the first example can be compared with each other.

This example is different from the above-described first example in that the element separation part P_ISO extends so as to surround the active region in each of the first region RA and the second region RB (see FIG. 5A for the region RA and the region RB). That is, in this example, the region RA and the region RB are separated from each other by the element separation part P_ISO.

Herein, in a case where the element separation part P_ISO is formed on the semiconductor substrate, a lattice defect such as a dangling bond (uncombined hand) of the semiconductor member exists in a boundary portion between the element separation part P_ISO and the semiconductor member in contact with the element separation part P_ISO. Since this lattice defect may provide a noise component such as a dark current to the photodiode (PD_N or the like), the lattice defect may become a cause of reduction in a focusing accuracy based on the above-described TOF method, for example. Similarly, this lattice defect may also provide a noise component to the floating diffusion (FD1_N or the like).

In view of the above, to suppress an influence of the above-described lattice defect, in this example, as illustrated in FIGS. 7A and 7D, impurity regions RP_CS1 to RP_CS4 and RN_CS1 to RN_CS4 are formed along a side surface and a bottom surface of the element separation part P_ISO. These impurity regions RP_CS1 and the like may also be referred to as a "channel stopper" since the impurity region restricts a migration pathway of the charges in the semiconductor member of a certain conductivity type by a region of a conductivity type different from the above-described conductivity type (so as to be away from the element separation part P_ISO and its vicinity, for example).

Specifically, the region RP_CS1 is a P-type high concentration impurity region formed on one surface of the N-type region RN2 so as to be in contact with the side surface of the element separation part P_ISO. The region RP_CS2 is a P-type high concentration impurity region formed on the other side surface of the N-type region RN2 so as to be in contact with the side surface of the element separation part P_ISO. In this example, the P-type regions RP_CS1 and RP_CS2 mutually have a substantially equal P-type impurity concentration. Similarly, the region RN_CS1 is an N-type high concentration impurity region formed on one surface of the P-type region RP2 so as to be in contact with the side surface of the element separation part P_ISO. The region RN_CS2 is an N-type high concentration impurity region formed on the other surface of the P-type region RP2 so as to be in contact with the side surface of the element separation part P_ISO. In this example, the N-type regions RN_CS1 and RN_CS2 mutually have a substantially equal N-type impurity concentration.

The region RP_CS3 is a P-type impurity region formed so as to be in contact with the P-type region RP_CS1 and also the bottom surface of the element separation part P_ISO and has a low P-type impurity concentration with respect to the P-type region RP_CS1. The region RP_CS4 is a P-type impurity region formed so as to be in contact with the P-type region RP_CS2 and also the bottom surface of the element separation part P_ISO and has a low P-type impurity concentration with respect to the P-type region RP_CS2. In this example, the P-type regions RP_CS3 and RP_CS4 mutually have a substantially equal P-type impurity concentration. Similarly, the region RN_CS3 is an N-type impurity region formed so as to be in contact with the N-type region RN_CS1 and also the bottom surface of the element separation part P_ISO and has a low N-type impurity concentration with respect to the N-type region RN_CS1. The region RN_CS4 is an N-type impurity region formed so as to be in contact with the N-type region RN_CS2 and also the bottom surface of the element separation part P_ISO and has a low N-type impurity concentration with respect to the N-type region RN_CS2. In this example, the N-type regions RN_CS3 and RN_CS4 mutually have a substantially equal N-type impurity concentration.

Herein, as illustrated in FIG. 7D, the P-type region RP_CS4 and the N-type region RN_CS4 respectively correspond to portion on the N-type region RN2 side (first portion) and portion on the P-type region RP2 side (second portion) on the bottom surface of the element separation part P_ISO and are close or adjacent to each other. However, as described above, the impurity concentration of the regions RP_CS4 and RN_CS4 is set to be relatively low (as compared with the high concentration impurity regions RP_CS2 and RN_CS2). For this reason, an intensity of electric fields that may be generated between the regions RP_CS4 and RN_CS4 is lower than an intensity of electric fields generated at the impurity concentration at a comparable level with the high concentration impurity regions RP_CS2 and RN_CS2. Thus, according to the present structure, it is possible to improve the withstand pressure with respect to breakdown that may be generated between the regions RP_CS4 and RN_CS4. In the unit pixel PX according to the present structure, since the P-type region RP_CS3 (the N-type region RN_CS3) may be adjacent to the N-type region RN_CS3 (the P-type region RP_CS3) in the adjacent pixel, the same also applies to the P-type region RP_CS3 and the N-type region RN_CS3.

Thus, according to the present structure, the effect similar to the above-described first example may be attained. In addition, even in a case where the element separation part such as the STI is used for the separation of the region RA and the region RB, it is also possible to reduce the noise components derived from the dark current, and/or it is possible to improve the withstand pressure with respect to breakdown. Furthermore, according to the present structure, since channel widths of the transistors MN1, MN2, MP1, and MP2 are regulated by the element separation parts, this configuration is also advantageous for a design of the transistors MN1, MN2, MP1, and MP2 (for example, determination of parameters such as the channel widths or the like).

Herein, the mode has been exemplified in which the high concentration impurity region RP_CS1 or the like extends in the Y direction across the area including both the photodiode (PD_N or the like) and the floating diffusion (FD1_N or the like) in the plan view. However, the high concentration impurity region RP_CS1 or the like is not limited to the shape of this example. For example, the high concentration impurity region RP_CS1 or the like may extend in the Y direction across an area including the photodiode among the photodiode and the floating diffusion (that is, between the electrodes GTX1 and GTX2). In another example, the high concentration impurity region RP_CS1 or the like may also extend in the X direction. That is, the high concentration impurity region RP_CS1 or the like may be formed annularly along the outer edges of the respective active regions of the region RA and the region RB.

Figure 8A:
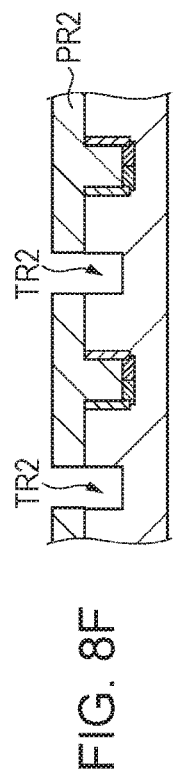
FIGS. 8A, 8B, 8C, 8D, 8E, 8F, 8G, 8H, 8I, and 8J are explanatory diagrams for describing an example of a formation method for the pixel structure.

FIGS. 8A, 8B, 8C, 8D, 8E, 8F, 8G, 8H, 8I, and 8J are schematic diagrams for describing states in respective processes of an example of the forming method for the present structure. In the process of FIG. 8A, a first photoresist PR1 having an opening is formed on the N-type region RN1, and a trench TR1 is formed in the N-type region RN1 by etching using the photoresist PR1. A position of an opening of the photoresist PR1 corresponds to a position of portion of the element separation part P_ISO described above.

Figure 8B:
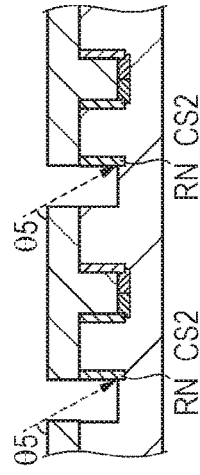

In the process of FIG. 8B, an N-type impurity (phosphorus, arsenic, or the like) is injected into the trench TR1 via the opening of the photoresist PR1 to form the N-type high concentration impurity region RN_CS1. An angle θ1 defined by a direction of this injection and a top surface of the photoresist PR1 (hereinafter, will be referred to as an "injection angle") may be determined on the basis of a width and a depth of the trench TR1 and a thickness of the photoresist PR1 such that the N-type impurity is injected from one side surface of the trench TR1.

Figure 8C:
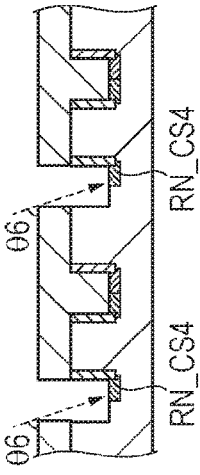

In the process of FIG. 8C, the N-type impurity is injected into the trench TR1 via the opening of the photoresist PR1 at a dose amount lower than a dose amount in the process of FIG. 8B to form the N-type impurity region RN_CS3. An injection angle θ2 in the present process may be determined on the basis of the width and the depth of the trench TR1 and the thickness of the photoresist PR1 such that the N-type impurity is injected to one side on a bottom surface of the trench TR1. It should be noted that injection energy in the present process may be changed from injection energy in the process of FIG. 8B when necessary.

Figure 8D:
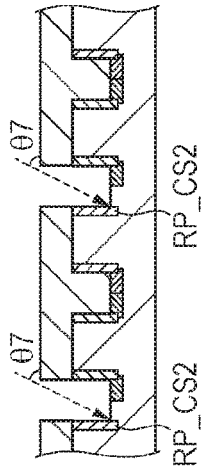

In the process of FIG. 8D, a P-type impurity (boron or the like) is injected to the other side surface of the trench TR1 (side surface on the opposite side to the side surface where the N-type impurity is injected in the process of FIG. 8B) by a similar procedure to the process of FIG. 8B to form the P-type high concentration impurity region RP_CS1. An injection angle θ3 in the present process is substantially equal to the injection angle θ1.

Figure 8E:
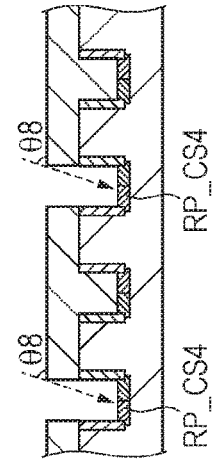

In the process of FIG. 8E, the P-type impurity is injected to the other side on the bottom surface of the trench TR1 (opposite side to the side where the N-type impurity is injected in the process of FIG. 8C) by a similar procedure to the process of FIG. 8C to form the P-type impurity region RN_CS3. An injection angle θ4 in the present process is substantially equal to the injection angle θ2.

Figure 8F:
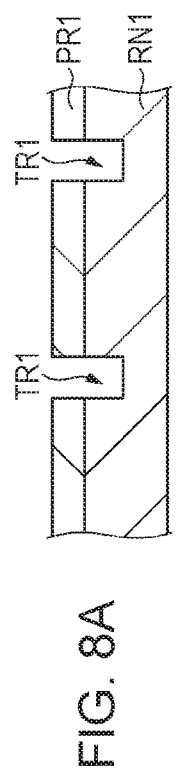
Figure 8G:
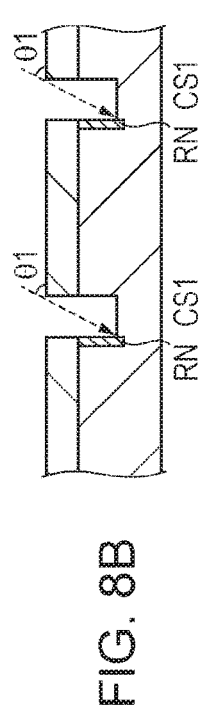
Figure 8H:
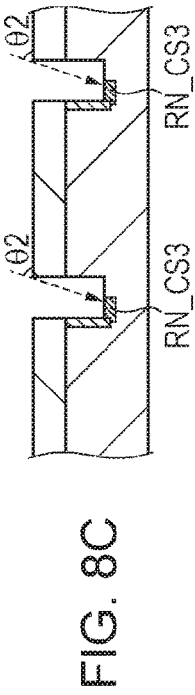
Figure 8I:
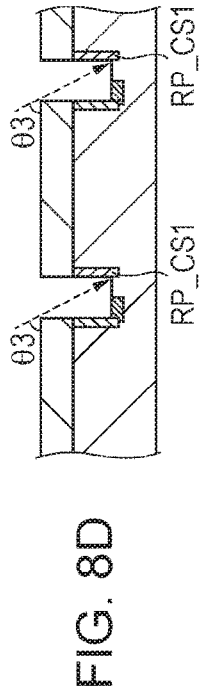
Figure 8J:
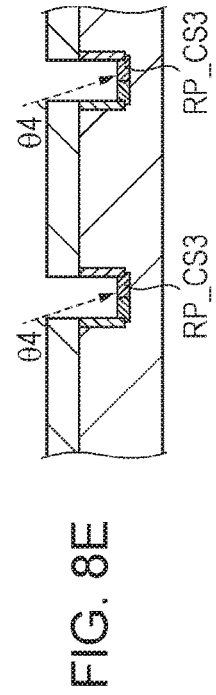

In the process of FIG. 8F, after the photoresist PR1 is removed, a second photoresist PR2 having another opening is formed on the N-type region RN1, and a trench TR2 is formed in the N-type region RN1 by etching using the photoresist PR2. A position of this opening corresponds to a position of another portion of the element separation part P_ISO described above.

According to the processes of FIGS. 8B, 8C, 8D, 8E, and 8F, the impurities of the corresponding conductivity types are injected by using the common photoresist PR1 while the injection angle is changed, so that it is possible to sequentially form the impurity regions RN_CS1, RN_CS3, RP_CS1, and RP_CS3.

In the processes of FIGS. 8G, 8H, 8I, and 8J, the impurities of the corresponding conductivity types are injected via the opening of the photoresist PR2 while the injection angle is changed by the similar procedures in the processes of FIGS. 8B, 8C, 8D, and 8E to sequentially form the impurity regions RN_CS2, RN_CS4, RP_CS2, and RP_CS4.

It should be noted that an injection angle θ5 (see FIG. 8G) when the N-type high concentration impurity region RN_CS2 is formed and an injection angle θ7 (see FIG. 8I) when the P-type high concentration impurity region RP_CS2 is formed are substantially equal to the injection angles θ1 and θ3. In addition, an injection angle θ6 (see FIG. 8H) when the N-type impurity region RN_CS4 is formed and an injection angle θ8 (see FIG. 8J) when the P-type impurity region RP_CS4 is formed are substantially equal to the injection angles θ2 and θ4.

OTHER EXAMPLES

Some modes have been exemplified in the above, but the present invention is not limited to these examples. The configurations may be partly altered in a range without departing from the gist of the present invention. For example, some of the above-described examples may be partly combined with each other.

Figure 9:
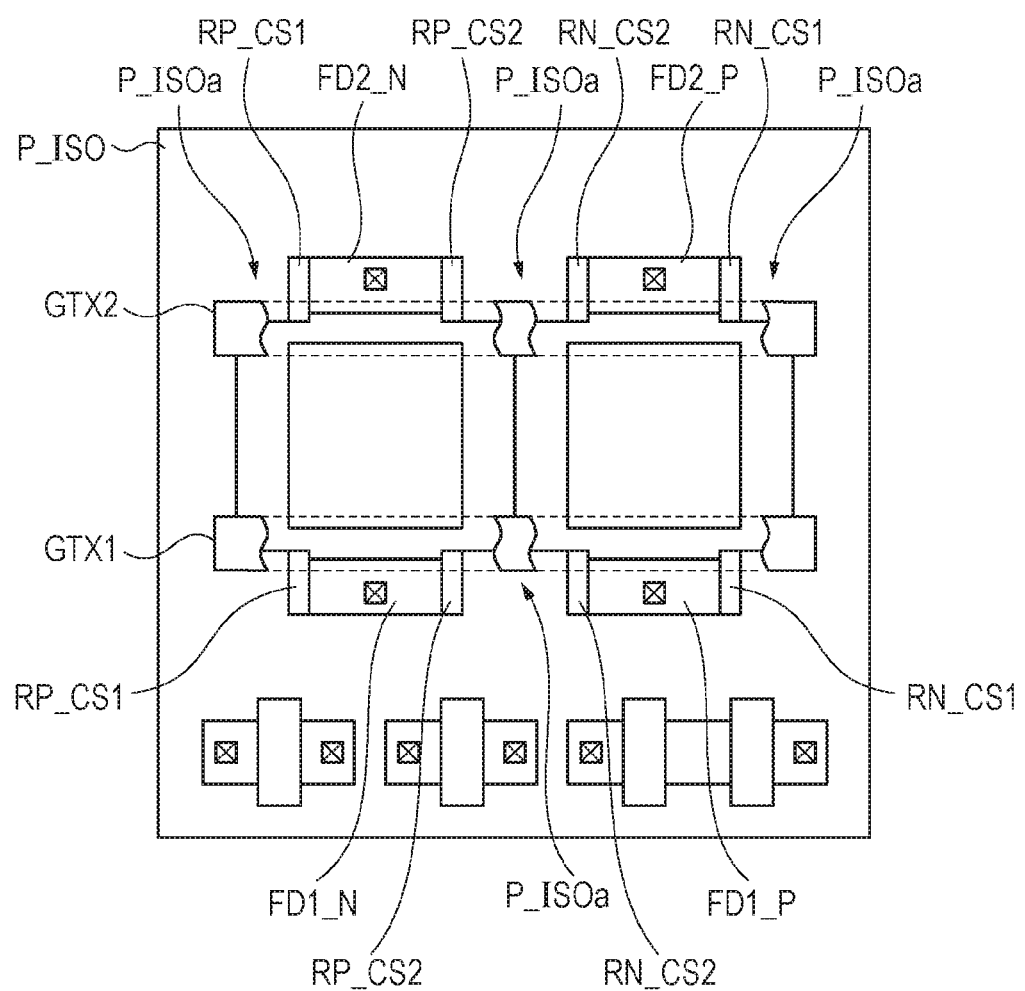
FIG. 9 is an explanatory diagram for describing an example of the structure of the pixel.

For example, as illustrated in FIG. 9, the second example and the third example can be combined with each other (FIG. 9 is illustrated so as to correspond to FIG. 6A of the second example or FIG. 7A of the third example for comparison). According to this example, while the part P_ISOa in the element separation part P_ISO surrounds the floating diffusion FD1_N or the like, the impurity region RP_CS1 or the like is formed along the side surface and the bottom surface of the part P_ISOa. According to this example, the effects of both the second example and the third example may be attained.

FIG. 10A1 is a schematic diagram for describing a first layout of the unit pixel PX in a plan view (plan view with respect to a top surface of the semiconductor substrate or a surface parallel to the top surface. This will be hereinafter simply referred to as a "plan view"). Herein, to distinguish from a second layout of the unit pixel PX which will be described below, the unit pixel PX of the first layout will be denoted as a "pixel PX_A". FIG. 10B is a schematic diagram illustrating a cross-sectional structure as being cut by a cut line XB-XB. FIG. 10C is a schematic diagram illustrating a cross-sectional structure as being cut by a cut line XC1-XC. FIG. 10D is a schematic diagram illustrating a cross-sectional structure as being cut by a cut line XD-XD. In the drawings, to facilitate understanding of the present structure, a correspondence relationship of the respective drawings is illustrated by using the X direction (corresponding to the first direction), the Y direction (corresponding to the second direction) intersecting with the X direction, and the Z direction intersecting with the plane surface formed by the X direction and the Y direction. It should be noted that the X direction and the Y direction may respectively correspond to the row direction and the column direction of the pixel array 210 described above.

For example, the P-type semiconductor region RP1 is formed in the N-type semiconductor region RN1 corresponding to at least portion of the semiconductor substrate. Herein, a state of "being formed in the N-type region RN1" means a state of "being surrounded by N-type region RN1.

That is, the P-type region RP1 is surrounded by the N-type region RN1. The same also applies to the following descriptions of the other regions.

The photodiode PD_N, the transistors MN1 and MN2 and the capacitances C1_N and C2_N described above are formed in the P-type region RP1. For example, the photodiode PD_N is constituted by forming the N-type semiconductor region RN2 in the P-type region RP1. The capacitance C1_N is constituted by forming the N-type floating diffusion FD1_N (first floating diffusion) in the P-type region RP1. Similarly, the capacitance C2_N is constituted by forming the N-type floating diffusion FD2_N in the P-type region RP1.

It should be noted that the N-type region RN2 corresponding to the cathode of the photodiode PD_N corresponds to the source of the NMOS transistor MN1 (integrated with the source), and the floating diffusion FD2_N corresponds to the drain of the NMOS transistor MN1 (integrated with the drain). From this viewpoint, the NMOS transistor MN1 corresponding to the MOS transistor for the charge transfer may be represented as a transfer part. The same also applies to the other transistors MN2, MP1, and MP2.

The electrode GTX1 corresponding to the gate of the NMOS transistor MN1 is arranged between the floating diffusion FD1_N and the N-type region RN2 in the plan view and also on the semiconductor substrate via the insulating film F. Similarly, the electrode GTX2 corresponding to the gate of the NMOS transistor MN2 is arranged between the floating diffusion FD2_N and the N-type region RN2 in the plan view and also the semiconductor substrate via the insulating film F.

The photodiode PD_P, the PMOS transistors MP1 and MP2, and the capacitances C1_P and C2_P described above are formed in the N-type region RN1. For example, the photodiode PD_P is constituted by forming the P-type semiconductor region RP2 in the N-type region RN1. The capacitance C1_P is constituted by forming the P-type floating diffusion FD1_P (second floating diffusion) in the N-type region RN1. Similarly, the capacitance C2_P is constituted by forming the P-type floating diffusion FD2_P in the N-type region RN1. The electrode GTX1 corresponds not only to the gate of the NMOS transistor MN1 but also to the gate of the PMOS transistor MP1. That is, the gate of the NMOS transistor MN1 and the gate of the PMOS transistor MP1 are commonly formed by the electrode GTX1. Similarly, the electrode GTX2 also corresponds to the gate of the PMOS transistor MP2. It should be noted that it is sufficient even when the gate electrode GTX1 (GTX2) is not commonly formed, and an electrode corresponding to each of the NMOS transistor MN1 and the PMOS transistor MP1 (MN2 and MP2) may be individually formed.

The element group formed in the P-type region RP1 (the photodiode PD_N, the transistors MN1 and MN2, and the capacitances C1_N and C2_N) are arranged along the Y direction. For example, the photodiode PD_N is arranged between the capacitances C1_N and C2_N. Herein, the capacitance C1_N corresponding to the readout target is located on a side where the transistors MN3 to MN6 are arranged which will be described below, and the capacitance C2_N is located on the opposite side to the above-described side, but the sides may be reversed. The NMOS transistor MN1 is arranged between the capacitance C1_N and the photodiode PD_N, and the NMOS transistor MN2 is arranged between the capacitance C2_N and the photodiode PD_N. The group of these elements is denoted as a "first element group EG1" in the drawing.

The same also applies to the element group formed in the N-type region RN1 (the photodiode PD_P, the PMOS transistors MP1 and MP2, and the capacitances C1_P and C2_P). The group of these elements is denoted as a "second element group EG2" in the drawing.

The element group EG1 and the element group EG2 are aligned in the X direction so as to correspond to each other, and those element groups may be configured to have a mutually symmetric relationship in terms of structures or electric characteristics. That is, the photodiode PD_N, the transistors MN1 and MN2, and the capacitances C1_N and C2_N may be arranged so as to be respectively aligned with the photodiode PD_P, the PMOS transistors MP1 and MP2, and the capacitances C1_P and C2_P in the X direction.

The elements or portions corresponding to the transistors MN3 to MN6 are individually arranged at positions further away from the positions in the Y direction where the element groups EG1 and EG2 described above are arranged. The electrodes GRES1, GRES2, GSF, and GSEL in the drawing respectively correspond to gates of the transistors MN3, MN4, MN5, and MN6. The group of these elements is denoted as a "third element group EG3" in the drawing. It should be noted that the R-type region RP3 illustrated in FIG. 10B and FIG. 10C correspond to the P-type wells of the transistors MN3 to MN6. A mode is illustrated in this example in which the P-type regions RP1 and RP3 are mutually independent (separated by the N-type region RN1), but these regions may be formed in an integrated manner.

The element group EG1, the element group EG2, and the element group EG3 may be electrically separated from one another by the PN junction. In this example, the PN junction is formed by the P-type region RP1 and the N-type region RN1 in the X direction and the Y direction and is formed by the N-type region RN1 and the R-type region RP3 in the Y direction. The electric separation based on the PN junction may be achieved by a potential barrier formed between two regions having mutually different conductivity types, and an intrinsic region (i-type region) may exist between the above-described two regions.

FIG. 10A2 is a schematic diagram for describing the second layout of the unit pixel PX in the plan view. Herein, to distinguish from the unit pixel PX_A of the above-described first layout, the unit pixel PX of the second layout is denoted as a "pixel PX_B". The unit pixel PX_B has substantially the same circuit configuration as the unit pixel PX_A but is different from the unit pixel PX_A in that the position of the element group EG1 and the position of the element group EG2 are opposite with regard to a top surface layout. That is, the photodiode PD_N and the photodiode PD_P are arranged in the X direction in the stated order in the unit pixel PX_A and are arranged in the X direction in the opposite order to the above-described order in the unit pixel PX_B. The same also applies to the transistors MN1, MN2, MP1, and MP2, and the capacitances C1_N, C2_N, C1_P, and C2_P.

Figure 11A:
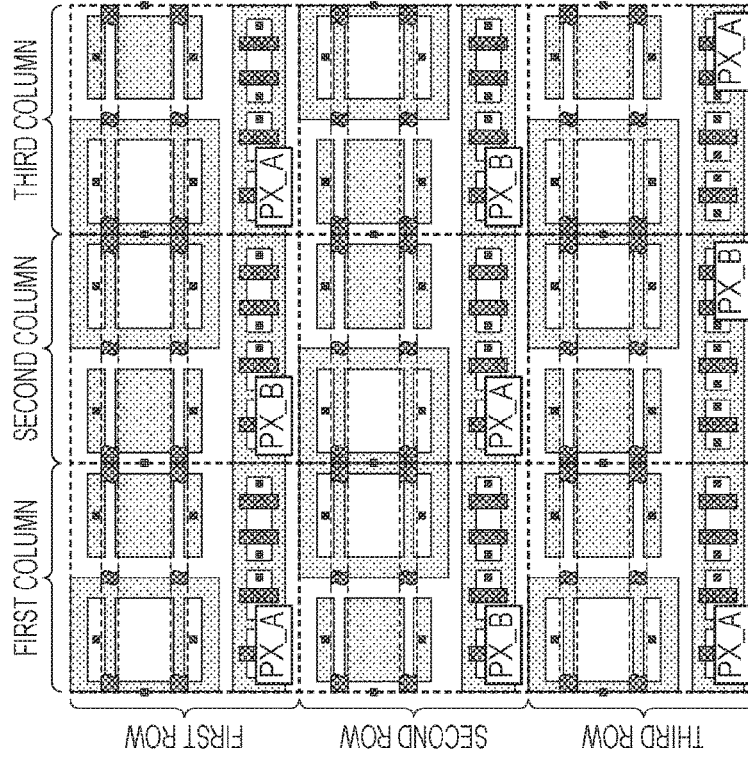
FIGS. 11A and 11B are explanatory diagrams for describing an example of a configuration of a pixel array.

FIG. 11A is an explanatory diagram for describing a first example of a pixel array in the pixel array 210. Herein, to facilitate the descriptions, the unit pixel PX having three rows×three columns is illustrated. According to the first example, the unit pixels PX_A and PX_B described above are alternately arranged along the X direction (herein, a row direction). Specifically, with regard to the first row, the unit pixel PX_A is arranged in the first column, the unit pixel PX_B is arranged in the second column, and the unit pixel PX_A is arranged in the third column. The same also applies to the second row and the third row. That is, in the layout illustrated in FIG. 11A, the groups of the unit pixels PX in the respective first to third rows have a mutually translational symmetric relationship in a column direction.

According to the above-described pixel array, the two mutually adjacent unit pixels PX_A and PX_B in the row direction share the P-type region RP1. In addition, the other two mutually adjacent unit pixels PX_A and PX_B in the row direction share the N-type region RN1. Herein, for example, "sharing of the P-type region RP1" means that "the integrally (continuously) formed single (one block) P-type region RP1 corresponds to two or more elements", and the P-type region RP1 is not separated by another element different from the P-type region RP1 between the two or more elements. That is, the P-type region RP1 is integrally formed across a boundary portion of the adjacent unit pixels PX_A and PX_B and its vicinity and is not separated by the N-type region or the element separation part (shallow trench isolation (STI) or the like).

It should be noted that a concentration distribution of the P-type impurity may exist in the shared P-type region RP1. For example, a configuration may be adopted in which charges between the unit pixels PX are electrically separated from each other by a potential gradient formed by this concentration distribution of the P-type impurity. The same also applies to a case where the N-type region RN1 is shared. With regard to the N-type region RN1, the N-type region RN1 continues via a portion below the P-type region RP1 between the adjacent pixels PX_A and PX_B.

The shared P-type region RP1 corresponds to the anode of the photodiode PD_N and also corresponds to a terminal on the voltage V1 side of the capacitances C1_N and C2_N. The shared N-type region RN1 corresponds to the cathode of the photodiode PD_P and also corresponds to a terminal on the voltage V2 side of the capacitances C1_P and C2_P.

Herein, according to the first example, since the P-type region RP1 or the N-type region RN1 is shared between the adjacent pixels, as compared with a case where only the unit pixels PX_A (or PX_B) are aligned, it is possible to reduce the number of separation parts based on the PN junction. Thus, a distance between the element group EG1 and the element group EG2 (for example, a distance between the photodiode PD_N and the photodiode PD_P) in the respective pixels can be increased or secured.

The distance between the two photodiodes may be measured on the basis of the outer edge of the N-type region RN2 corresponding to the cathode in the plan view with regard to the photodiode PD_N and the outer edge of the P-type region RP2 corresponding to the anode in the plan view with regard to the photodiode PD_P. For example, the distance between the photodiode PD_N and the photodiode PD_P is a distance between the N-type region RN2 corresponding to the cathode of the photodiode PD_N and the P-type region RP2 corresponding to the anode of the photodiode PD_P in the plan view.

For example, as illustrated in an enlarged view in FIG. 11A, a distance between the photodiode PD_N and the photodiode PD_P in the unit pixel PX_B in the third row and the second column is set as a distance L1. In addition, a distance between the photodiode PD_N in the unit pixel PX_B in the third row and the second column and the photodiode PD_N in the unit pixel PX_A in in the third row and the third column corresponding to its adjacent pixel is set as a distance L2. In this case, L1>L2 is established. Hereinafter, this state will be described in detail.

When a distance between the element group EG1 and the element group EG2 in the respective pixels (distance for appropriately separate these element groups from each other by the PN junction) is not sufficiently secured, latch-up may be generated, for example. In addition, to realize the separation of these elements (or to prevent the generation of the latch-up), the P-type impurity concentration in the P-type region RP1 and the N-type impurity concentration in the N-type region RN1 may be respectively set to be relatively high (as compared with other neighboring regions). Since a reverse bias is applied to the PN junction between the P-type region RP1 and the N-type region RN1, breakdown may be generated. Thus, according to the first example, it is possible to increase the distance between the element group EG1 and the element group EG2, and it can be mentioned that it is advantageous to improve a latch-up immunity or a breakdown withstand pressure.

On the other hand, the separation based on the PN junction is not necessary between the two element groups EG1 (or between the two element groups EG2) between the adjacent pixels. For this reason, it is not necessary to set the distance between the mutual element groups EG1 (or the distance between the mutual element groups EG2) to be as long as the distance between the element group EG1 and the element group EG2. That is, the two elements mutually having the same sort or type (for example, the polarity, the conductivity type, or the like) may be arranged to be close to each other as compared with the case of the two elements having the mutually different sorts or types.

Thus, according to the pixel array in the first example illustrated in FIG. 11A, while the latch-up immunity or the breakdown withstand pressure is improved, the respective elements of the element groups EG1 and EG2 can be appropriately electrically separated from each other in the respective pixels and between the adjacent pixels. In addition, according to the first example, since at least one of the P-type region RP1 and the N-type region RN1 is shared between the adjacent pixels, it is also possible to arrange a contact plug CT (power supply part) configured to supply a predetermined voltage or power to those pixels at a boundary portion between the adjacent pixels, which is also advantageous in terms of layout designs.

Figure 11B:
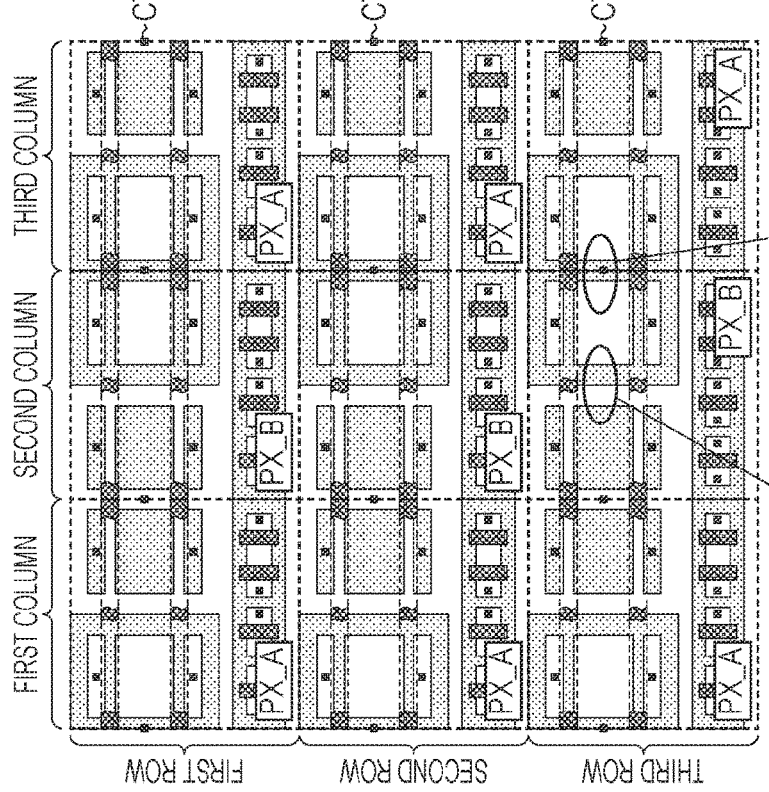
Figure 12:
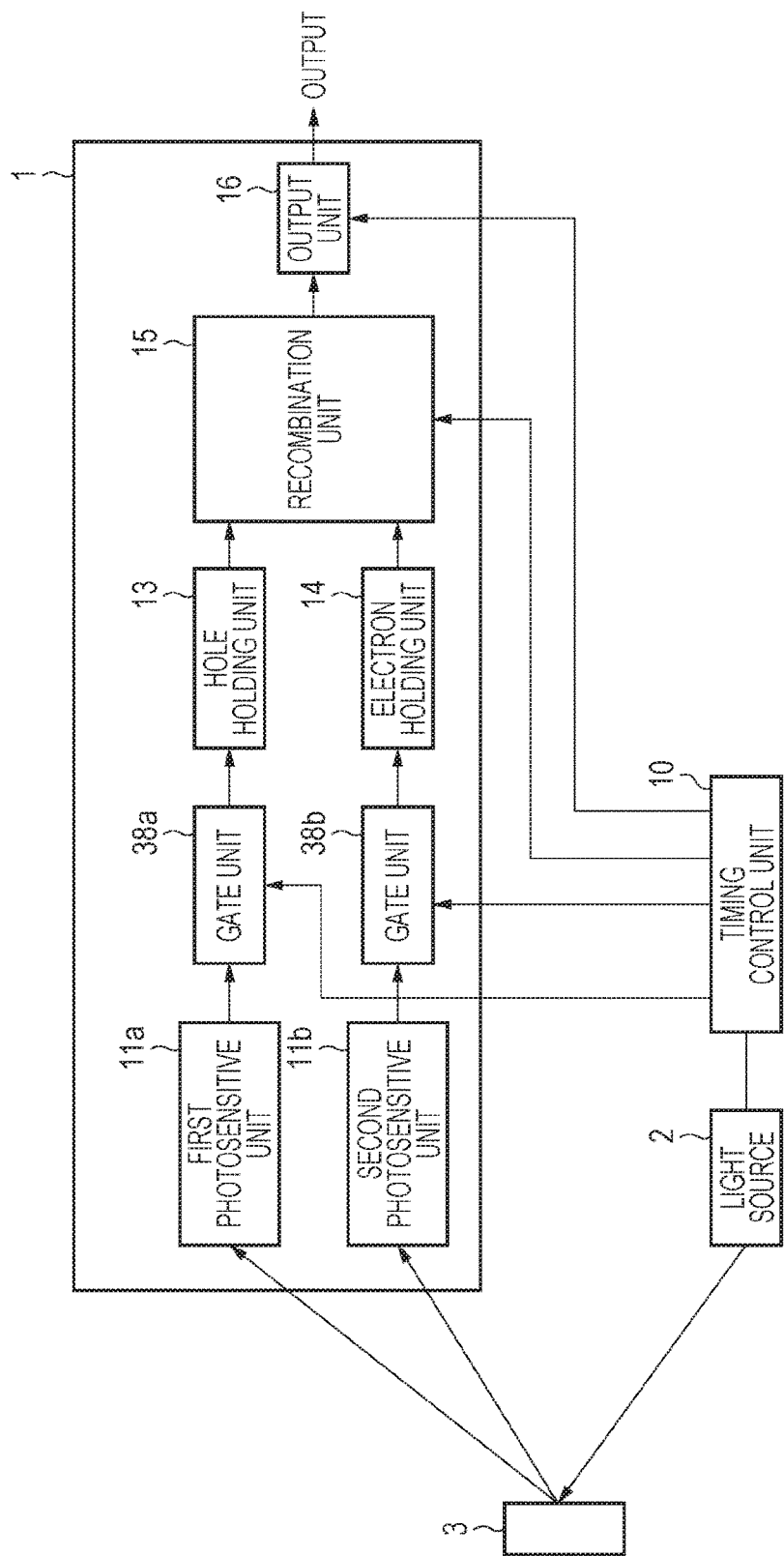
FIG. 12 is an explanatory diagram for describing a configuration of a reference example.

FIG. 11B is an explanatory diagram for describing the second example of the pixel array in the pixel array 210. In the above-described first example (see FIG. 11A), the unit pixels PX_A and PX_B are alternately aligned in the row direction, and the unit pixels PX_A or the unit pixels PX_B are aligned in the column direction. In contrast to this, the unit pixels PX_A and PX_B are alternately aligned in both the row direction and the column direction in the second example. That is, according to the second example, with regard to the second row, the unit pixel PX_B is arranged in the first column, the unit pixel PX_A is arranged in the second column, and the unit pixel PX_B is arranged in the third column. According to the second example, interactions between the adjacent pixels in the column direction (for example, parasitic capacitances of the respective elements in the column direction) can be equalized, for example, and it is possible to prevent generation of vertical stripes on an image in a case where the apparatus 100 is used as the image pickup apparatus, for example.

Several modes have been exemplified above, but the present invention is not limited to these examples, and the configurations may also be partly altered in a range without departing from the gist the invention. For example, the structure where the element groups EG1 to EG3 are electrically separated from one another by the PN junction is exemplified in the above-described example, but these element groups may also be separated from one another by another part in the unit pixel PX. The other part may include, for example, an element separation part having an STI structure, an element separation part formed of local oxidation of silicon (LOCOS), or the like.

In addition, in the present specification, the apparatus 100 corresponding to an applied exemplary embodiment of the present invention is exemplified as the image pickup apparatus. However, embodiments of the present invention may be, of course, used for other purposes and is not limited to the modes exemplified herein. For example, an embodiment of the present invention may be applied to a human detection sensor, an obstacle sensor, or the like that may be mounted to an automobile or the like or may be applied to a game console or the like that realizes a virtual space. In addition, for example, embodiments of the present invention are not limited to a structure for performing focusing on the basis of the TOF method and may be applied to a structure for adjusting a focal position on the basis of a phase difference detection method.

In addition to the above, each term described in the present specification is merely used for a purpose of describing the exemplary embodiments of the present invention, and the present invention is not, of course, limited to a strict sense of the term and may also include its equivalent.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-244393, filed Dec. 15, 2015, and Japanese Patent Application No. 2015-252403, filed Dec. 24, 2015, which are hereby incorporated by reference herein in their entirety.

What is claimed is:

1. A semiconductor apparatus comprising:
   a first photodiode arranged in a semiconductor substrate;
   a second photodiode arranged in the semiconductor substrate;
   a charge voltage conversion part connected to a cathode of the first photodiode and an anode of the second photodiode and configured to convert a charge amount in accordance with electrons generated in the first photodiode and holes generated in the second photodiode into a voltage; and
   a signal generation part configured to generate a signal in accordance with the voltage of the charge voltage conversion part,
   wherein an element separation part constituted by an insulator is arranged between an active region where the first photodiode is arranged and an active region where a transistor constituting the signal generation part is arranged and between an active region where the second photodiode is arranged and an active region where a transistor constituting the signal generation part is arranged.

2. The semiconductor apparatus according to claim 1, wherein the first photodiode and the second photodiode are arranged in the same active region.

3. The semiconductor apparatus according to claim 1, wherein the first photodiode and the second photodiode are electrically separated from each other by a PN junction.

4. The semiconductor apparatus according to claim 1, wherein the charge voltage conversion part includes
   a first floating diffusion corresponding to an N-type semiconductor region, and
   a second floating diffusion corresponding to a P-type semiconductor region, the semiconductor apparatus further comprising:
a first transfer part configured to transfer the electrons of the first photodiode to the first floating diffusion; and
a second transfer part configured to transfer the holes of the second photodiode to the second floating diffusion.

5. The semiconductor apparatus according to claim 4,
wherein, when one direction in parallel with a top surface of the semiconductor substrate is set as a first direction, and a direction that is in parallel with the top surface of the semiconductor substrate and also intersecting with the first direction is set as a second direction,
in a plan view with respect to the top surface of the semiconductor substrate,
the first photodiode and the second photodiode are aligned in the first direction, and
wherein the transistor constituting the signal generation part is aligned with at least one of the first photodiode and the second photodiode in the second direction.

6. The semiconductor apparatus according to claim 5,
wherein the first photodiode and the first floating diffusion are aligned in the second direction, and
wherein the second photodiode and the second floating diffusion are aligned in the second direction.

7. The semiconductor apparatus according to claim 4, the element separation part extends between the first floating diffusion and the second floating diffusion.

8. The semiconductor apparatus according to claim 7,
wherein the extended part of the element separation part includes
a first side surface on a first floating diffusion side,
a second side surface on a second floating diffusion side, and
a bottom surface that connects the first side surface to the second side surface and includes a first portion on the first floating diffusion side and a second portion on the second floating diffusion side,
wherein the semiconductor substrate includes a P-type first impurity region formed between the first side surface and the first floating diffusion, an N-type second impurity region formed between the second side surface and the second floating diffusion, a P-type third impurity region formed between the first portion of the bottom surface and the first floating diffusion, and an N-type fourth impurity region formed between the second portion of the bottom surface and the second floating diffusion, and
wherein a difference in impurity concentrations between the P-type third impurity region and the N-type fourth impurity region is smaller than a difference in impurity concentrations between the P-type first impurity region and the N-type second impurity region.

9. The semiconductor apparatus according to claim 8, wherein the impurity concentration of the P-type third impurity region is lower than the impurity concentration of the P-type first impurity region, and the impurity concentration of the N-type fourth impurity region is lower than the impurity concentration of the N-type second impurity region.

10. The semiconductor apparatus according to claim 1,
wherein the element separation part extends between the first photodiode and the second photodiode so as to electrically separate the first photodiode and the second photodiode from each other,
wherein the extended part of the element separation part includes
a first side surface on a first photodiode side,
a second side surface on a second photodiode side, and
a bottom surface that connects the first side surface to the second side surface and includes a first portion on the first photodiode side and a second portion on the second photodiode side,
wherein the semiconductor substrate includes a P-type first impurity region formed between the first side surface and the first photodiode, an N-type second impurity region formed between the second side surface and the second photodiode, a P-type third impurity region formed between the first portion of the bottom surface and the first photodiode, and an N-type fourth impurity region formed between the second portion of the bottom surface and the second photodiode, and
wherein a difference in impurity concentrations between the P-type third impurity region and the N-type fourth impurity region is smaller than a difference in impurity concentrations between the P-type first impurity region and the N-type second impurity region.

11. The semiconductor apparatus according to claim 10,
wherein the impurity concentration of the P-type third impurity region is lower than the impurity concentration of the P-type first impurity region, and the impurity concentration of the N-type fourth impurity region is lower than the impurity concentration of the N-type second impurity region.

12. The semiconductor apparatus according to claim 1, wherein a plurality of units each including the charge voltage conversion part, the first photodiode, the second photodiode, and the signal generation part are aligned in a matrix.

13. The semiconductor apparatus according to claim 1,
wherein the charge voltage conversion part is a first charge voltage conversion part, and
wherein the semiconductor apparatus is a second charge voltage conversion part different from the first charge voltage conversion part and is connected to the cathode of the first photodiode and the anode of the second photodiode, the semiconductor apparatus further comprising a second charge voltage conversion part configured to convert a charge amount in accordance with the electrons generated in the first photodiode and the holes generated in the second photodiode into a voltage.

14. The semiconductor apparatus according to claim 13,
wherein the second charge voltage conversion part includes
a third floating diffusion corresponding to an N-type semiconductor region, and
a fourth floating diffusion corresponding to a P-type semiconductor region,
the semiconductor apparatus further comprising:
a third transfer part configured to transfer the electrons of the first photodiode to the third floating diffusion; and
a fourth transfer part configured to transfer the holes of the second photodiode to the fourth floating diffusion.

15. The semiconductor apparatus according to claim 13,
wherein the first charge voltage conversion part includes
a first floating diffusion corresponding to an N-type semiconductor region, and
a second floating diffusion corresponding to a P-type semiconductor region,
wherein the second charge voltage conversion part includes
a third floating diffusion corresponding to an N-type semiconductor region, and
a fourth floating diffusion corresponding to a P-type semiconductor region, wherein, when one direction in parallel with a top surface of the semiconductor substrate is set as a first direction, and a direction that is in parallel with the top surface of the semiconductor substrate and also intersecting with the first direction is set as a second direction, the first photodiode and the second photodiode are aligned in the first direction, wherein the first photodiode, the first floating diffusion, and the third floating diffusion are aligned in the second direction, and wherein the second photodiode, the second floating diffusion, and the fourth floating diffusion are aligned in the second direction.

16. An information processing apparatus comprising:
the semiconductor apparatus according to claim 1; and
a processing component configured to process a signal output from the semiconductor apparatus.

17. A photoelectric conversion apparatus comprising:
a semiconductor substrate provided with a plurality of light detecting units, each of the plurality of light detecting units including a first photodiode including a first semiconductor region of a first conductivity type which accumulates one of electrons and holes and a second photodiode including a second semiconductor region of a second conductivity type different from the first conductivity type which accumulates the other one of the electrons and the holes, the photoelectric conversion apparatus outputting a signal based on charges of at least one of the first photodiode and the second photodiode in each of the plurality of light detecting units,
wherein the plurality of light detecting units include a first unit and a second unit that are adjacent to each other, and the second photodiode of the first unit and the second photodiode of the second unit are located between the first photodiode of the first unit and the first photodiode of the second unit in a plan view with respect to a top surface of the semiconductor substrate.

18. The photoelectric conversion apparatus according to claim 17,
wherein a distance between the second semiconductor region of the first unit and the second semiconductor region of the second unit in the plan view is shorter than at least one of
a distance between the first semiconductor region of the first unit and the second semiconductor region of the first unit and
a distance between the first semiconductor region of the second unit and the second semiconductor region of the second unit.

19. The photoelectric conversion apparatus according to claim 17, wherein the second photodiode of the first unit and the second photodiode of the second unit include a third semiconductor region of the first conductivity type.

20. The photoelectric conversion apparatus according to claim 19, further comprising:
a contact plug that is arranged between the first unit and the second unit in the view and supplies a voltage to the third semiconductor region.

21. The photoelectric conversion apparatus according to claim 17, wherein the first photodiode of the first unit and the first photodiode of the second unit include a fourth semiconductor region of the second conductivity type.

22. The photoelectric conversion apparatus according to claim 17, wherein the first photodiode and the second photodiode are electrically separated from each other by a PN junction in at least one of the first unit and the second unit.

23. The photoelectric conversion apparatus according to claim 17,
wherein the plurality of light detecting units further include a third unit adjacent to the second unit, and the second unit is arranged between the first unit and the third unit,
wherein the first photodiode of the second unit and the first photodiode of the third unit are located between the second photodiode of the second unit and the second photodiode of the third unit in the plan view.

24. The photoelectric conversion apparatus according to claim 23,
wherein a distance between the first semiconductor region of the first unit and the first semiconductor region of the third unit in the plan view is shorter than at least one of
a distance between the first semiconductor region of the first unit and the second semiconductor region of the first unit and
a distance between the first semiconductor region of the third unit and the second semiconductor region of the third unit.

25. The photoelectric conversion apparatus according to claim 23,
wherein the first photodiode of the first unit and the first photodiode of the third unit includes a fourth semiconductor region of the second conductivity type.

26. The photoelectric conversion apparatus according to claim 25, further comprising:
a contact plug that is arranged between the second unit and the third unit in the plan view and supplies a voltage to the fourth semiconductor region.

27. The photoelectric conversion apparatus according to claim 17,
wherein the first unit and the second unit are aligned in a first direction,
wherein each of the plurality of light detecting units further includes
a first floating diffusion arranged at a position shifted in a second direction that intersects with the first direction from a position where the first photodiode is arranged,
a first transistor corresponding to a MOS transistor configured to electrically connect the first photodiode and the first floating diffusion to each other in response to a control signal,
a second floating diffusion that is adjacent to the first floating diffusion in the first direction and is arranged at a position shifted in the second direction from a position where the second photodiode is arranged, and
a second transistor corresponding to a MOS transistor that is adjacent to the first transistor in the first direction and electrically connects the second photodiode and the second floating diffusion to each other in response to a control signal.

28. The photoelectric conversion apparatus according to claim 17, wherein each of the plurality of light detecting units further includes a circuit part configured to output a signal from at least one of the first photodiode and the second photodiode.

29. The photoelectric conversion apparatus according to claim 28,
wherein the first unit and the second unit are aligned in a first direction, and
wherein the circuit part in each of the plurality of light detecting units includes a plurality of transistors, and the plurality of transistors are arranged along the first direction in positions shifted in a second direction that intersects with the first direction from a region where the first photodiode and the second photodiode are arranged.

30. The photoelectric conversion apparatus according to claim 17, wherein the first unit and the second unit are aligned in a first direction, and wherein the plurality of light detecting units are arranged in a manner that a group of the light detecting units aligned along the first direction has a translational symmetric relationship along a second direction that intersects with the first direction.

31. The photoelectric conversion apparatus according to claim 17, wherein the first unit and the second unit are aligned in a first direction, and wherein the plurality of light detecting units are aligned in a manner that a unit in which the first photodiode and the second photodiode are aligned in a stated order of the first photodiode and the second photodiode in the first direction and a unit in which the first photodiode and the second photodiode are aligned in a stated order of the second photodiode and the first photodiode in the first direction are alternately located along a second direction that intersects with the first direction.

32. The photoelectric conversion apparatus according to claim 17, wherein the first unit and the second unit are aligned in a first direction, and wherein the first photodiode and the second photodiode are alternately arranged along a second direction that intersects with the first direction in the plurality of light detecting units.

33. An information processing apparatus comprising:

the photoelectric conversion apparatus according to claims 17; and a processing component configured to process a signal from the photoelectric conversion apparatus.

* * * * *